US012727435B2

(12) United States Patent
Miura et al.

(10) Patent No.: US 12,727,435 B2
(45) Date of Patent: Sep. 1, 2026

(54) TEST METHOD, MANUFACTURING METHOD, PANEL LEVEL PACKAGE, AND TEST APPARATUS

(71) Applicant: ADVANTEST CORPORATION, Tokyo (JP)

(72) Inventors: Takeo Miura, Saitama (JP); Yasuaki Homma, Kanagawa (JP)

(73) Assignee: ADVANTEST CORPORATION, Tokyo (JP)

( * ) Notice: Subject to any disclaimer, the term of this patent is extended or adjusted under 35 U.S.C. 154(b) by 413 days.

(21) Appl. No.: 18/190,949

(22) Filed: Mar. 27, 2023

(65) Prior Publication Data

US 2023/0343631 A1 Oct. 26, 2023

(30) Foreign Application Priority Data

Apr. 26, 2022 (JP) ................................ 2022-072614

(51) Int. Cl.
*H01L 21/68* (2006.01)
*H10P 72/70* (2026.01)
*H10W 90/00* (2026.01)

(52) U.S. Cl.
CPC ........... *H10P 72/74* (2026.01); *H10W 90/701* (2026.01)

(58) Field of Classification Search
CPC ........... H01L 21/6835; H01L 23/49816; H01L 22/14; H01L 21/78; H01L 23/48; H01L 23/13; H01L 23/538; H01L 25/0655; H01L 2224/023; H01L 2224/97; G01R 31/2831; G01R 31/2874; G01R 31/00; G01R 31/2896; G01R 31/01; G01R 31/2863; G01R 31/2891
(Continued)

(56) References Cited

U.S. PATENT DOCUMENTS 6,177,288 B1 1/2001 Takiar
6,400,173 B1 * 6/2002 Shimizu ............. H01L 21/6835 324/762.02

(Continued)

FOREIGN PATENT DOCUMENTS

CN 1416163 A 5/2003
CN 101030573 A 9/2007

(Continued)

OTHER PUBLICATIONS

Office Action issued for related Japanese Application No. 2022-072591, issued by the Japanese Patent Office on Apr. 18, 2023 (drafted on Apr. 11, 2023).

(Continued)

*Primary Examiner* — Vu A Vu

(57) ABSTRACT

Provided is a test method including: placing, on a placement unit, a panel level package in which a plurality of unsingulated devices are formed in a matrix; bringing a plurality of contacts electrically connected to a plurality of terminals of a test circuit into contact with a plurality of contact terminals provided on one side in the panel level package in a row direction of the matrix and connected via a plurality of lead-out wirings to an internal circuit of each device in each row of the plurality of devices, respectively; and testing, by the test circuit, each device in the each row electrically connected via the plurality of contacts.

20 Claims, 17 Drawing Sheets

700

(58) Field of Classification Search
USPC .......................................................... 438/106
See application file for complete search history.

(56) References Cited

U.S. PATENT DOCUMENTS

| | | | | |
|---|---|---|---|---|
| 6,483,328 | B1 * | 11/2002 | Eldridge | H01L 21/4853 257/E23.024 |
| 6,891,385 | B2 * | 5/2005 | Miller | G01R 31/2875 324/750.08 |
| 6,956,391 | B2 * | 10/2005 | Kamitani | G01R 31/016 324/750.05 |
| 7,071,721 | B2 * | 7/2006 | Furukawa | G01R 31/319 324/762.03 |
| 7,120,513 | B1 * | 10/2006 | Akram | G06F 11/006 700/109 |
| RE40,105 | E * | 2/2008 | Momohara | G01R 1/07342 324/754.03 |
| 7,586,186 | B2 * | 9/2009 | Honda | H01L 23/49816 257/E23.079 |
| 7,733,106 | B2 * | 6/2010 | Dozier, II | G01R 31/2889 324/754.03 |
| 8,026,733 | B2 * | 9/2011 | Lee | G01R 31/2889 324/754.01 |
| 8,581,610 | B2 * | 11/2013 | Miller | G01R 31/31926 324/754.01 |
| 2004/0177293 | A1 | 9/2004 | Ricca | |
| 2005/0268186 | A1 * | 12/2005 | Chen | G01R 31/2831 714/721 |
| 2008/0210935 | A1 | 9/2008 | Ebara | |
| 2011/0018564 | A1 | 1/2011 | Washio | |
| 2012/0214261 | A1 | 8/2012 | Komoto | |
| 2017/0373012 | A1 | 12/2017 | Inaoka | |
| 2019/0101583 | A1 | 4/2019 | Kim | |
| 2020/0051902 | A1 | 2/2020 | Chou | |
| 2020/0233033 | A1 | 7/2020 | Kim | |
| 2020/0379029 | A1 | 12/2020 | Hasegawa | |
| 2021/0156902 | A1 * | 5/2021 | Ke | H01L 22/32 |
| 2021/0313298 | A1 | 10/2021 | Archer | |
| 2022/0122946 | A1 | 4/2022 | Chi | |
| 2022/0276090 | A1 | 9/2022 | Hasegawa | |
| 2023/0045422 | A1 | 2/2023 | Huang | |

FOREIGN PATENT DOCUMENTS

| | | | |
|---|---|---|---|
| CN | 104089873 | A | 10/2014 |
| CN | 108269745 | A | 7/2018 |
| CN | 113611623 | A | 11/2021 |
| JP | 2007258728 | A | 10/2007 |
| JP | 2018006408 | A | 1/2018 |
| JP | 2020197430 | A | 12/2020 |
| JP | 2022131940 | A | 9/2022 |
| KR | 20000006167 | A | 1/2000 |
| KR | 102361861 | B1 | 2/2022 |
| WO | 2005070178 | A2 | 8/2005 |

OTHER PUBLICATIONS

Office Action issued for related Korean Application 10-2023-0033124, issued by the Korean Intellectual Property Office on Apr. 25, 2025.

Office Action issued for counterpart Taiwanese Application 112109736, transmitted from the Taiwan Intellectual Property Office on Jul. 30, 2024 (issued on Jul. 29, 2024).

Office Action issued for counterpart Korean Application 10-2023-0033181, issued by the Korean Intellectual Property Office on Apr. 25, 2025.

Office Action issued for related U.S. Appl. No. 18/190,947, issued by the US Patent and Trademark Office on Sep. 9, 2025.

Office Action issued for related Korean Application 10-2023-0033124, issued by the Korean Intellectual Property Office on Dec. 27, 2025.

Office Action issued for counterpart Chinese Application 202310237201.2, issued by The State Intellectual Property Office of People's Republic of China on Mar. 31, 2026.

Office Action issued for related U.S. Appl. No. 18/190,947, issued by the US Patent and Trademark Office on Apr. 29, 2026 .

Office Action issued for related Chinese Application 2023102368840.7, issued by The State Intellectual Property Office of People's Republic of China on May 22, 2026.

* cited by examiner

110

TEST METHOD, MANUFACTURING METHOD, PANEL LEVEL PACKAGE, AND TEST APPARATUS

The contents of the following Japanese patent application(s) are incorporated herein by reference:

NO. 2022-072614 filed in JP on Apr. 26, 2022

BACKGROUND

1. Technical Field

The present invention relates to a test method, a manufacturing method, a panel level package, and a test apparatus.

2. Related Art

Patent Document 1 discloses "a semiconductor package having a panel level package (herein, referred to as PLP) structure in which thin film wiring process and assembly process are performed on a large panel scale and a method for manufacturing the same" (paragraph 0001).

CITATION LIST

Patent Document

Patent Document 1: Japanese Patent Application Publication No. 2018-006408

DESCRIPTION OF EXEMPLARY EMBODIMENTS

Hereinafter, embodiments of the present invention will be described, but the embodiments do not limit the invention according to the claims. In addition, not all of the combinations of features described in the embodiments are essential to the solving means of the invention.

Figure 1:
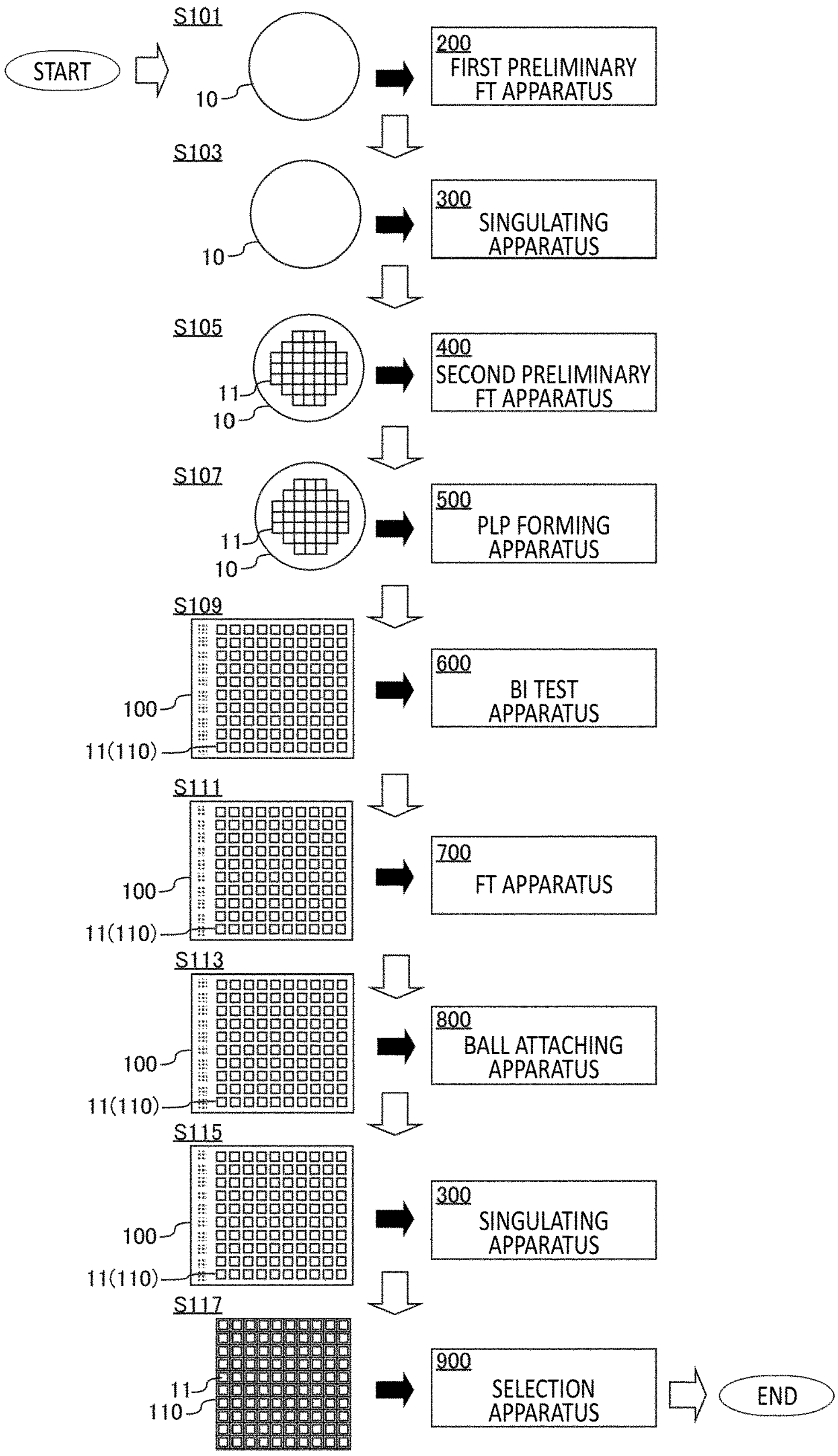
FIG. 1 is an explanatory diagram for explaining an example of a flow of a manufacturing method for manufacturing a device 110.

FIG. 1 is an explanatory diagram for explaining an example of a flow of a manufacturing method for manufacturing a device 110. The manufacturing method according to the present embodiment includes testing the device 110 such as an electronic device or an optical device. A test method of the device 110 according to the present embodiment is characterized by testing a plurality of devices 110 in a state of a panel level package (PLP) in which the plurality of unsingulated devices 110 are formed. Note that in the following description, the panel level package may be referred to as PLP.

The flow illustrated in FIG. 1 is started when an arbitrary conveyance means such as a handler brings a wafer 10 into a first preliminary FT apparatus 200. Note that the wafer 10, the PLP 100, and the device 110 illustrated in FIG. 1 may be conveyed between a plurality of apparatuses illustrated in FIG. 1 by the arbitrary conveyance means.

In S101, the first preliminary FT apparatus 200 performs a functional test (FT) of the wafer 10. The wafer 10 may have a plurality of semiconductor chips 11 mounted on a substrate having a disk-shaped outer shape with a diameter of 300 mm, for example.

The first preliminary FT apparatus 200 may simultaneously perform the FT on all of the plurality of semiconductor chips 11 of the wafer 10, or may divide them into several sets, simultaneously perform the FT on all of the plurality of semiconductor chips 11 of each set, and sequentially perform the FT on each set.

In the FT by the first preliminary FT apparatus 200, for example, a pin is used which is exposed from the front surface of the semiconductor chip 11 and connected to the internal circuit of the semiconductor chip 11. The FT by the first preliminary FT apparatus 200 may be a test for individually confirming the operations of the plurality of semiconductor chips 11, for example, a functional test of the semiconductor chip 11 or a BIST test using a built-in self test (BIST) circuit of the semiconductor chip 11. When the FT by the first preliminary FT apparatus 200 is the BIST test using the BIST circuit of the semiconductor chip 11, the above-described pin may be referred to as a BIST pin.

The first preliminary FT apparatus 200 may determine a non-defective product/defective product of the wafer 10 as a whole without identifying each of the plurality of semiconductor chips 11. For example, when the number of individual semiconductor chips 11 determined to be a defective product is equal to or larger than a predetermined threshold value, the first preliminary FT apparatus 200 may determine that the wafer 10 as a whole is a defective product. The first preliminary FT apparatus 200 may stop using the wafer 10 determined to be a defective product.

In step S103, a singulating apparatus 300 singulates the wafer 10 determined as a non-defective product in step S101 into a plurality of semiconductor chips 11. The singulating apparatus 300 may thin the wafer 10 and then singulate the wafer into a plurality of semiconductor chips 11. Note that the singulating apparatus 300 may also singulate the wafer 10 determined as a defective product in step S101 into a plurality of semiconductor chips 11.

In S105, the second preliminary FT apparatus 400 performs FT on the plurality of singulated semiconductor chips 11. The second preliminary FT apparatus 400 individually and sequentially performs FT on the plurality of semiconductor chips 11. The second preliminary FT apparatus 400 may simultaneously perform individual FT on the plurality of semiconductor chips 11. The FT by the second preliminary FT apparatus 400 is an operation test of the semiconductor chip 11, and may be, for example, the functional test or the BIST test using the above-described pin.

The second preliminary FT apparatus 400 identifies each of the plurality of semiconductor chips 11 and determines a non-defective product/defective product for each semiconductor chip 11. Note that the second preliminary FT apparatus 400 may also perform the FT on the semiconductor chip 11 cut out from the wafer 10 determined as a defective product in step S101, and the semiconductor chip 11 determined as a non-defective product may be used in the next process.

As described above, after the FT for individually confirming the operations of the plurality of semiconductor chips 11 is executed in S105, in S107, a PLP forming apparatus 500 uses a plurality of semiconductor chips 11 determined to be non-defective products as a result of the FT to form a plurality of devices 110. More specifically, the PLP forming apparatus 500 forms the PLP 100 on which a plurality of unsingulated devices 110 each including the semiconductor chip 11 are formed.

The PLP 100 is larger in size than wafer 10 and includes a larger number of mounted semiconductor chips 11 than wafer 10. The PLP 100 may have, for example, a rectangular plate-like outer shape of 500 mm×500 mm or 500 mm×600 mm. In the PLP 100 according to the present embodiment, the plurality of devices 110 is arranged in a matrix.

In S109, a burn-in (BI) test apparatus 600 performs the BI test on the plurality of unsingulated devices 110 of the PLP 100. The BI test apparatus 600 accommodates the PLP 100 in a heating furnace as it is, and performs FT of each device 110 while applying temperature and voltage stress to the plurality of devices 110 in the PLP 100.

In the FT by the BI test apparatus 600, a pad is used which is exposed from the front surface of the end portion of the PLP 100 and connected to the internal circuit of the semiconductor chip 11 of the device 110. In the FT by the BI test apparatus 600, the functional test of each device 110 is performed in order to individually confirm the operations of the plurality of devices 110. The BI test apparatus 600 may identify each of the plurality of devices 110 and determine a non-defective product/defective product for each device 110.

In S111, the FT apparatus 700 performs FT on the plurality of unsingulated devices 110 of the PLP 100 under a plurality of different temperature conditions (step S111). In step S111, the FT apparatus 700 uses the PLP 100 as it is, and performs the FT of the plurality of devices 110 while adjusting the temperature of the PLP 100.

In the FT by the FT apparatus 700, a terminal is used which is exposed from the front surface of the device 110 and connected to the internal circuit of the semiconductor chip 11 of the device 110. The FT by the FT apparatus 700 may be a test for individually confirming the operations of the plurality of devices 110, for example, the functional test of the device 110 or the BIST test using the BIST circuit of the semiconductor chip 11 of the device 110. The FT apparatus 700 may identify each of the plurality of devices 110 and determine a non-defective product/defective product for each device 110.

After the BI test or the FT is performed on the plurality of devices 110 in the PLP 100 from S109 to S111, in S113, a ball attaching apparatus 800 attaches balls on the plurality of devices 110 in the PLP 100.

In S115, the singulating apparatus 300 cuts out and singulates the plurality of devices 110 from the PLP 100. The apparatus for singulating the plurality of devices 110 in S115 may be the same as or different from the apparatus for singulating the plurality of semiconductor chips 11 in S103.

In S117, a selection apparatus 900 selects a specific device 110 from the plurality of singulated devices 110 by using the results of one or both tests in S109 to S111, and this flow ends. In S117, for example, the selection apparatus 900 may determine whether the device 110 is excellent or poor on the basis of whether each of the BI test result and the FT result satisfies a predetermined criterion, or may determine on the basis of whether the BI test result and the FT result satisfy a predetermined comprehensive criterion by comprehensively viewing the BI test result and the FT result.

Among the above S101 to S117, some steps may be omitted, and other steps may be incorporated between these steps. For example, S101 may be omitted. In addition, after S117, for example, the FT apparatus 700 may again perform individual FT on each of the plurality of singulated devices 110.

Figure 2:
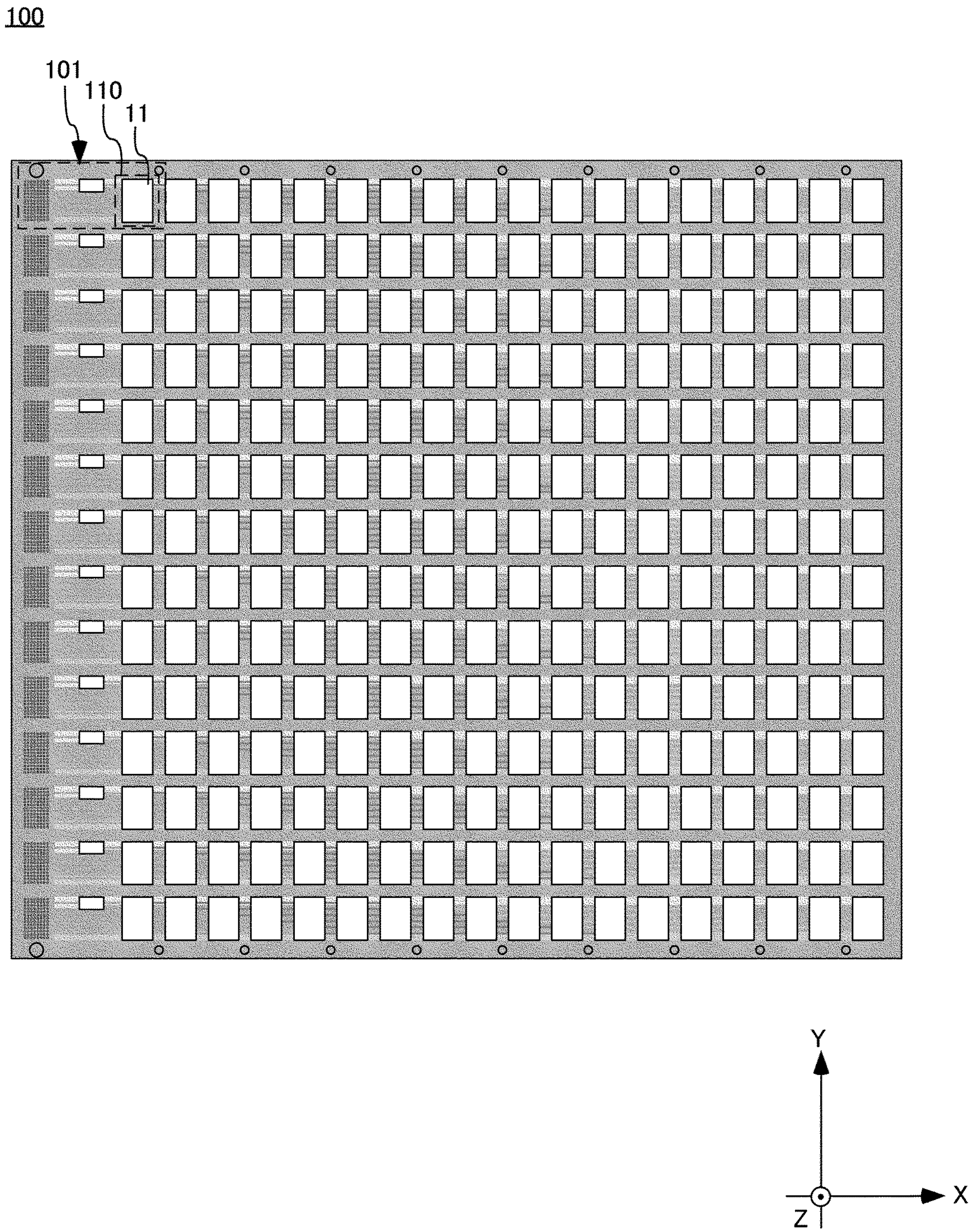
FIG. 2 is a schematic plan view of an example of a PLP 100.

FIG. 2 is a schematic plan view of an example of the PLP 100. In FIG. 2, some configurations embedded inside the PLP 100 are also illustrated for clarity of description. In FIG. 2, a partial region 101 of the PLP 100 is indicated by a rectangular broken line, and the unsingulated device 110 included in the region 101 is similarly indicated by a rectangular broken line. In addition, in FIG. 2, XYZ axes are illustrated, and a rightward direction toward a paper surface is defined as an X-axis positive direction, an upward direction toward the paper surface is defined as a Y-axis positive direction, and a direction from the back toward the front of the paper surface is defined as a Z-axis positive direction. In the following drawings, XYZ axes are similarly illustrated, and since the XYZ axes in the drawings correspond to each other, redundant description is omitted.

The PLP 100 according to the present embodiment has a square outline including two sides extending in an X-axis direction and two sides extending in a Y-axis direction on an XY plane. For the plurality of devices 110 arranged in the above-described matrix, the row direction of the matrix may be parallel to the X-axis direction, and in this case, the column direction of the matrix is parallel to the Y-axis direction. In the following description, each side of the PLP 100 may be referred to as a card edge.

In addition, the PLP 100 according to the present embodiment has a front surface and a back surface facing each other in different XY planes. FIG. 2 illustrates the front surface of the PLP 100. The back surface of the PLP 100 is a surface placed on a placement unit of the BI test apparatus 600 or the like, and the front surface of the PLP 100 is a surface opposite to the back surface and is a surface with which each contactor of the BI test apparatus 600 and the FT apparatus 700 comes into contact.

Figure 3:
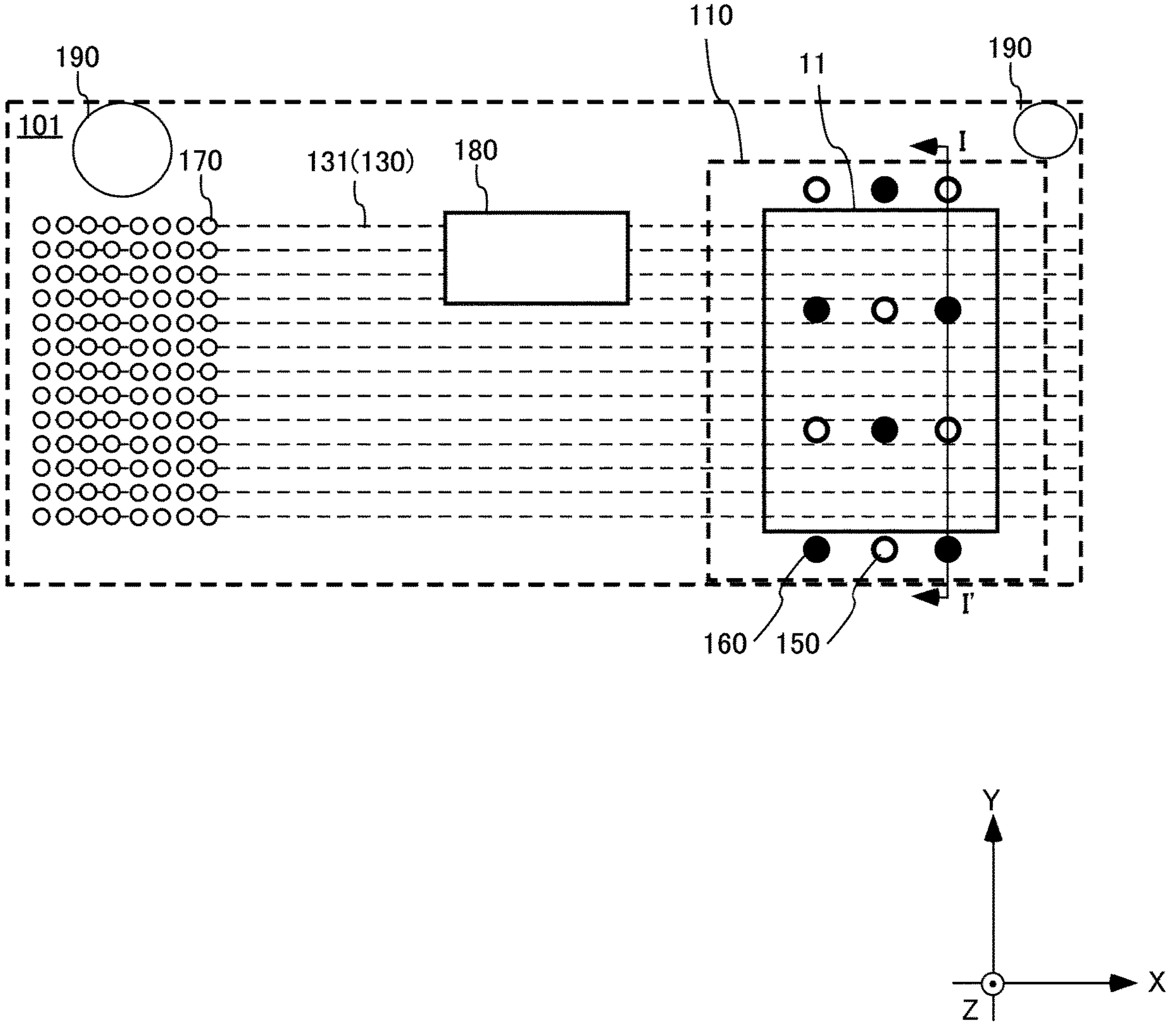
FIG. 3 is a partially enlarged view of a region 101 in FIG. 2.

FIG. 3 is a partially enlarged view of the region 101 in FIG. 2. Similarly to FIG. 2, for clarity of description, FIG. 3 illustrates a partial configuration embedded inside PLP 100, that is, the semiconductor chip 11, a lead-out wiring 131 of a redistribution layer (RDL) 130, and a fuse 180. In FIG. 3, the unsingulated device 110 included in the region 101 is indicated by a rectangular broken line, and the lead-out wiring 131 is indicated by a linear broken line.

The PLP 100 includes a redistribution layer 130 and a plurality of pads 170. The PLP 100 may further include a ball pad 150 and a sacrificial pad 160. The PLP 100 may also include the fuse 180 and a positioning member 190.

The redistribution layer 130 includes a plurality of lead-out wirings 131 connected to respective internal circuits of the plurality of semiconductor chips 11. The redistribution layer 130 is formed of, for example, a conductive member such as copper. The plurality of lead-out wirings 131 are wirings extending in the X-axis direction in the PLP 100.

The plurality of pads 170 are exposed on the front surface of the PLP 100. The plurality of pads 170 are provided on one side in the row direction of the matrix described above, that is, the card edge on an X-axis negative direction side among four sides of the rectangular shape forming the outer shape of the PLP 100.

The plurality of pads 170 are connected via the plurality of lead-out wirings 131 to the internal circuit of each semiconductor chip 11 in each row of the matrix among the plurality of semiconductor chips 11. In other words, by each of the plurality of lead-out wirings 131 extending in the X-axis direction in the PLP 100, each of the plurality of pads 170 is connected to the internal circuit of at least any one of the plurality of semiconductor chips 11 positioned in the same row in the matrix. Further, in other words, by one or more lead-out wirings 131, the internal circuit of the semiconductor chip 11 is connected to one or more pads 170 positioned in the same row in the matrix. Note that the plurality of pads 170 is an example of a plurality of contact terminals. The contact terminal may be a connector instead of the pad 170.

The ball pad 150 and the sacrificial pad 160 are exposed on the front surface of the PLP 100. The ball pad 150 and the sacrificial pad 160 are connected to the internal circuit of the semiconductor chip 11 via the redistribution layer 130. The ball pad 150 and the sacrificial pad 160 are formed on the device 110. Note that the sacrificial pad 160 is an example of at least one terminal of the device 110 exposed on the front surface of the PLP 100. The sacrificial pads 160 are also an example of the above-described terminal which is exposed from the front surface of the device 110 and connected to the internal circuit of the semiconductor chip 11 of the device 110.

The ball pad 150 is a pad on which a ball is mounted by the ball attaching apparatus 800, and the sacrificial pad 160 is a pad on which no ball is mounted. In addition, the ball pad 150 is a pad which does not come into contact with the contactor of the FT apparatus 700, and the sacrificial pad 160 is a pad which comes into contact with the contactor of the FT apparatus 700.

The fuse 180 is provided on at least any one of the plurality of lead-out wirings 131. The fuse 180 prevents a short circuit from occurring in the internal circuit of the semiconductor chip 11 or the like and firing. The positioning member 190 is a member for positioning the contactors of the BI test apparatus 600 and the FT apparatus 700 with respect to the PLP 100, and may be, for example, a hole. The positioning member 190 has a shape complementary to the positioning member provided in each contactor of the BI test apparatus 600 and the FT apparatus 700.

Figure 4:
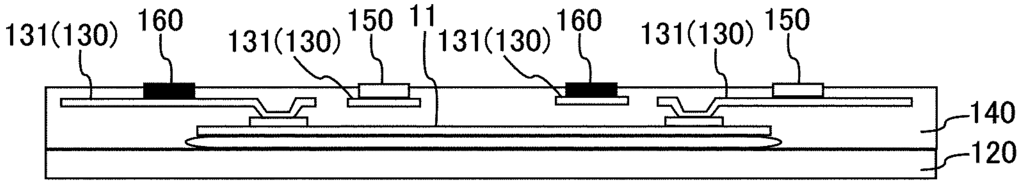
FIG. 4 is a schematic cross-sectional view of the PLP 100 taken along line I-I' in FIG. 3.
Figure 4:
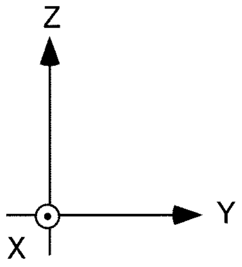

FIG. 4 is a schematic cross-sectional view of the PLP 100 taken along line I-I' in FIG. 3. FIG. 3 illustrates line I-I' on one device 110, and FIG. 4 is also a schematic cross-sectional view of the unsingulated devices 110 in the PLP 100.

The PLP 100 further includes a substrate 120 and a sealing portion 140. The substrate 120 has a rectangular outer shape in the XY plane and forms a contour in the XY plane of the PLP 100. The substrate 120 may be formed of a highly rigid metal such as steel, or may be formed of a highly rigid curable resin. As the substrate 120, for example, a supporting flat plate 1 disclosed in Japanese Patent Application Publication No. 2018 006408 may be used.

A plurality of semiconductor chips 11 may be arranged in a matrix on the substrate 120, and each semiconductor chip 11 on the substrate 120 may be fixed on the substrate 120 by, for example, an adhesive. The sealing portion 140 seals the redistribution layer 130 with a sealing material such as resin.

Figure 5:
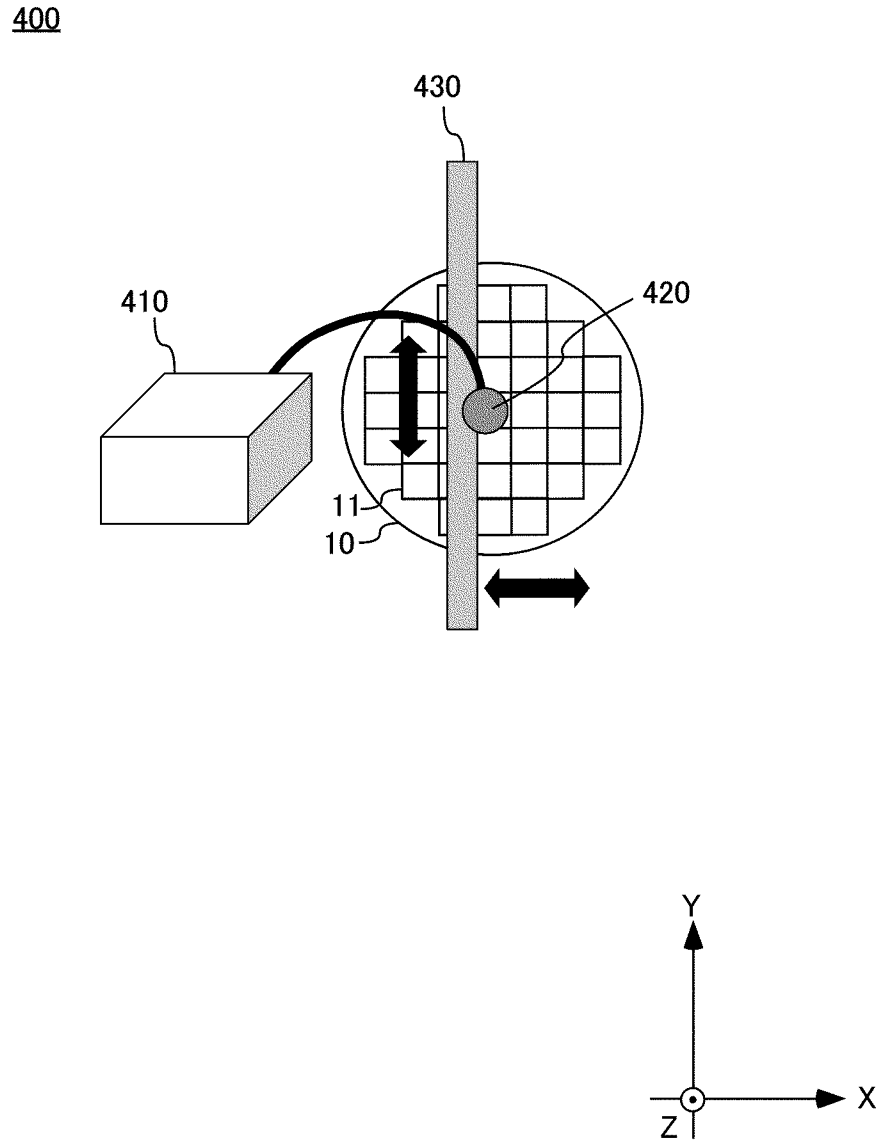
FIG. 5 is a schematic diagram of an example of a second preliminary FT apparatus 400 which performs FT of a semiconductor chip 11.

FIG. 5 is a schematic diagram of an example of the second preliminary FT apparatus 400 which performs FT of the semiconductor chip 11. In FIG. 5, the moving direction of the apparatus is indicated by a black arrow. The same applies to the following drawings, and redundant description will be omitted.

As an example, the second preliminary FT apparatus 400 includes a test apparatus 410, a contactor 420, and a slider 430. The test apparatus 410 is connected to the contactor 420, and individually performs FT on the plurality of semiconductor chips 11 of the wafer 10 by using the contactor 420.

The slider 430 is movable in each of the X-axis direction and the Y-axis direction while holding the contactor 420. In order to cause the contactor 420 to sequentially contact the plurality of semiconductor chips 11 aligned in each of the X-axis direction and the Y-axis direction on the wafer 10, the second preliminary FT apparatus 400 may drive the slider 430 holding the contactor 420 to control the contactors 420 to move in each of the X-axis direction and the Y-axis direction.

Figure 6:
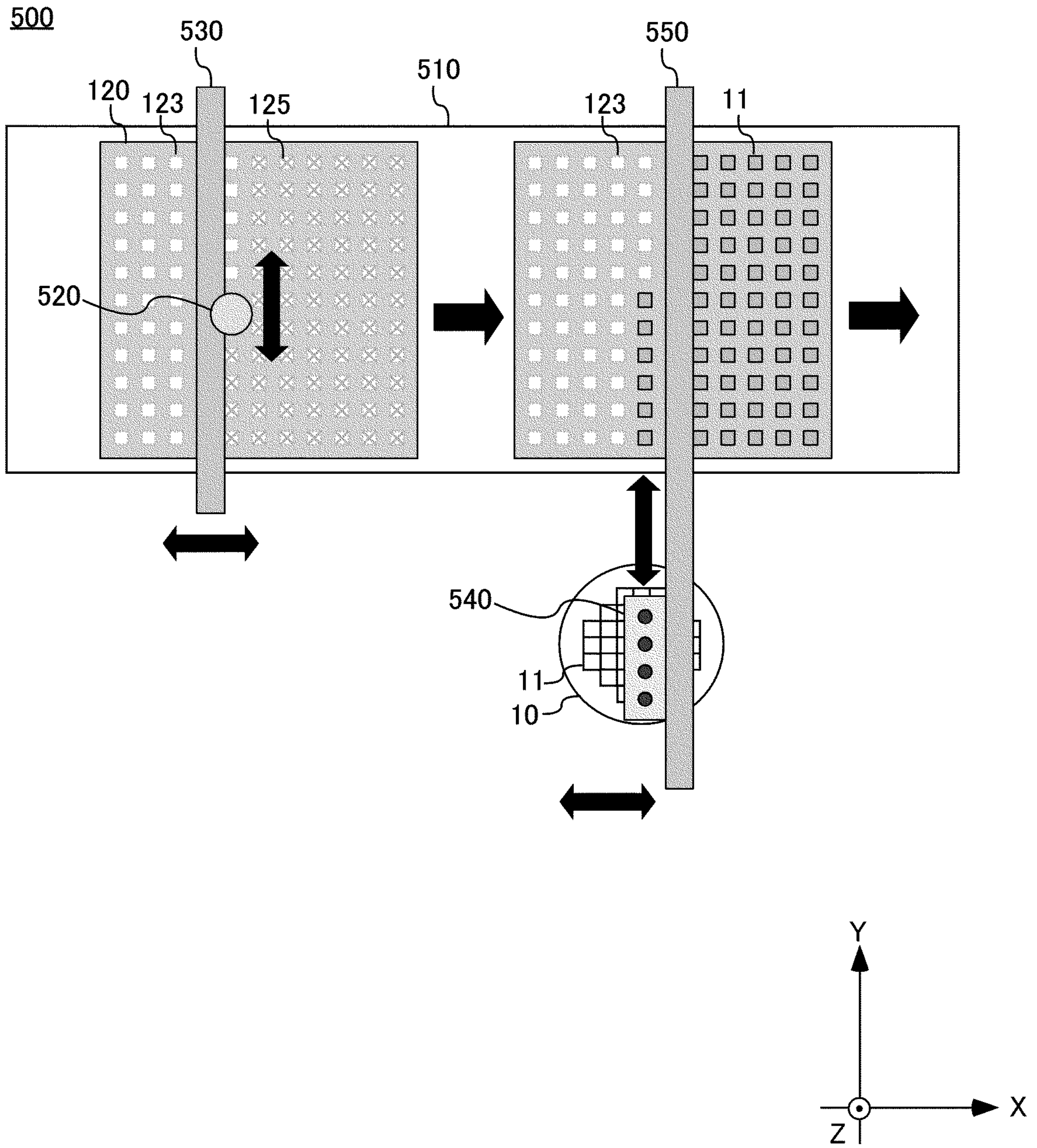
FIG. 6 is a schematic diagram of an example of a PLP forming apparatus 500 which forms a plurality of devices 110 in a PLP 100.

FIG. 6 is a schematic diagram of an example of the PLP forming apparatus 500 which forms the plurality of devices 110 in the PLP 100. As an example, the PLP forming apparatus 500 includes a conveyance table 510, an adhesive supply unit 520, a first slider 530, a chip arrangement unit 540, and a second slider 550.

The conveyance table 510 is a moving table for conveying the substrate 120 for the PLP 100 in one direction. The adhesive supply unit 520 supplies an adhesive for fixing the semiconductor chip 11 to the substrate 120 to the front surface of the substrate 120 conveyed by the conveyance table 510. In FIG. 6, a non-supply position 125 where the supply of the adhesive by the adhesive supply unit 520 is not completed is indicated by a square frame, and a supply completion position 123 where the supply of the adhesive by the adhesive supply unit 520 is completed is indicated by a symbol×in the square frame.

The first slider 530 is movable in each of the X-axis direction and the Y-axis direction while holding the adhesive supply unit 520 on the conveyance table 510. In order to bring the adhesive supply unit 520 close onto the non-supply position 125 aligned in each of the X-axis direction and the Y-axis direction on the substrate 120, the PLP forming apparatus 500 may drive the first slider 530 holding the adhesive supply unit 520 to control the first slider 530 to move in each of the X-axis direction and the Y-axis direction.

The chip arrangement unit 540 picks up a plurality of semiconductor chips 11 determined to be non-defective products by the second preliminary FT apparatus 400 from the plurality of semiconductor chips 11 of the wafer 10, and places the semiconductor chips at the supply completion position 123 on the front surface of the substrate 120 conveyed by the conveyance table 510. Accordingly, the plurality of semiconductor chips 11 are arranged in a matrix on the substrate 120.

The second slider 550 is movable in each of the X-axis direction and the Y-axis direction while holding the chip arrangement unit 540 on the conveyance table 510. In order to bring the chip arrangement unit 540 close onto the supply completion positions 123 aligned in each of the X-axis direction and the Y-axis direction on the substrate 120, the PLP forming apparatus 500 may drive the second slider 550 holding the chip arrangement unit 540 to control the second slider 550 to move in each of the X-axis direction and the Y-axis direction.

As illustrated in FIG. 6, the PLP forming apparatus 500 forms the PLP 100 illustrated in FIG. 2 by arranging a plurality of semiconductor chips 11 on a substrate 120 in a matrix and packaging the plurality of semiconductor chips 11 on the substrate 120 together.

Figure 7:
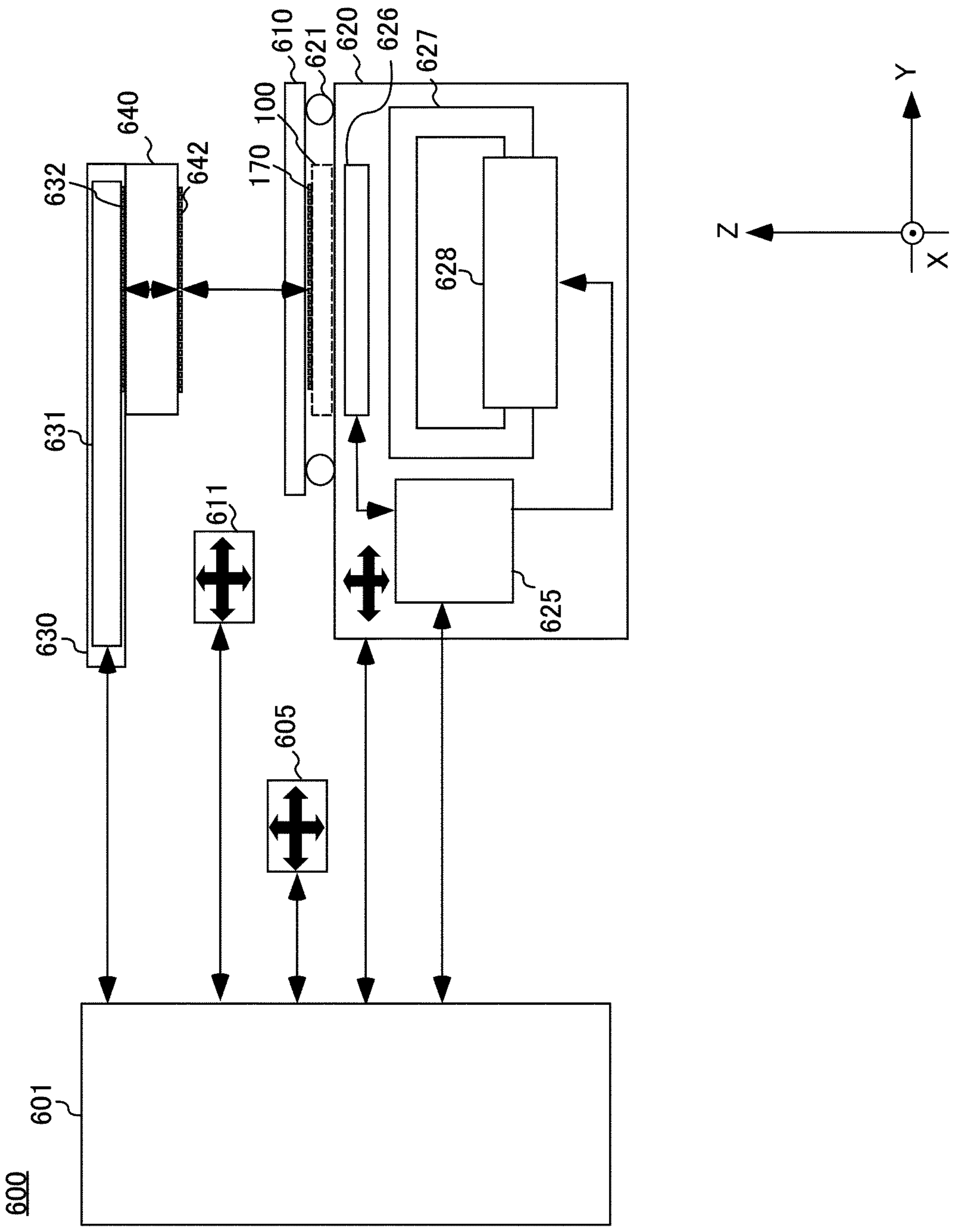
FIG. 7 is a block diagram of an example of a BI test apparatus 600 which performs a BI test on the plurality of unsingulated devices 110 in the PLP 100.

FIG. 7 is a block diagram of an example of the BI test apparatus 600 which performs a BI test on the plurality of unsingulated devices 110 in the PLP 100. In FIG. 7, the PLP 100 accommodated in the BI test apparatus 600 is indicated by a broken line. In addition, in FIG. 7, the flow direction of a signal is indicated by an arrow, and the same applies to the subsequent drawings.

The BI test apparatus 600 includes a controller 601, a conveyance unit 605, a placement unit 620, a cap holding unit 611, a cap 610, a temperature adjustment unit 625, a heater 626, a refrigerant supply unit 628, a refrigerant line 627, a contactor 640, a test board 630, and a test circuit 631.

The controller 601 controls each unit in the BI test apparatus 600 in order to perform an operation test of each device 110 under a predetermined temperature condition. In the present embodiment, the controller 601 is provided in a housing provided with the test board 630 or the like or a housing separate from the placement unit 620, but may be provided in the same housing as that of the test board 630 or the like or the placement unit 620.

The controller 601 may be a control computer, a workstation, a server computer, a general-purpose computer, or a computer such as a personal computer (PC). The controller 601 may be a computer system to which a plurality of computers are connected. Such a computer system is also a computer in a broad sense. In addition, the controller 601 may also be implemented by one or more virtual computer environments executable in a computer. Alternatively, the controller 601 may be a dedicated computer designed for operation test of the device, or may be dedicated hardware realized by a dedicated circuit.

The controller 601 instructs the conveyance unit 605 to place the PLP 100 before the BI test on the placement unit 620 in the heating furnace of the BI test apparatus 600 and to carry out the PLP 100 subjected to the BI test from the placement unit 620. The controller 601 also instructs the cap holding unit 611 to cover the cap 610 on the placement unit 620 in a state where the PLP 100 before the BI test is placed and to remove and hold the cap 610 from the placement unit 620 in a state where the PLP 100 subjected to the BI test is placed.

The controller 601 also controls the operation test of each device 110 in the PLP 100. When realized by a computer, the controller 601 may control the operation test of each device 110 by executing a test control program. The controller 601 instructs the placement unit 620 to suck and hold the PLP 100 placed on the placement surface and to bring a plurality of pads 170 connected to the plurality of devices 110 of the PLP 100 into contact with a plurality of contacts 642 of the contactor 640 collectively.

The controller 601 gives an instruction of the temperature condition of the operation test to the temperature adjustment unit 625 and causes the temperature adjustment unit 625 to adjust the temperature of the device 110 of the PLP 100. The controller 601 supplies a test program to the test circuit 631 in the test board 630 and causes the test circuit 631 to execute the test program. The controller 601 collects and records the test result of each device 110.

When receiving an instruction from controller 601, the placement unit 620 sucks and holds the PLP 100 on the placement surface. The placement unit 620 according to the present embodiment may have a vacuum chuck. The placement unit 620 may suck and hold the PLP 100 on the placement surface by vacuuming a space between the placement surface, a sealing member 621 provided on the placement surface, and the cap 610 covering the sealing member 621. Alternatively, the placement unit 620 may have an electrostatic chuck. In addition, the heater 626 and the refrigerant line 627 are provided on the placement unit 620 such that the placement surface on which the PLP 100 is placed can be uniformly heated and cooled.

The placement unit 620 movably supports the PLP 100. The placement unit 620 may be movable along the PLP 100 in the XYZ directions. The placement unit 620 may be capable of rotating the PLP 100 about a vertical axis perpendicular to the upper surface of the PLP 100. When receiving an instruction from the controller 601, the placement unit 620 moves the PLP 100 to bring the plurality of pads 170, which are provided on the card edge on the X-axis negative direction side of the PLP 100 placed on the placement surface, into collective contact with the plurality of contacts 642 of the contactor 640 fixed on the Z-axis positive direction side of the placement unit 620.

The temperature adjustment unit 625 is provided on the placement unit 620 and is connected to the controller 601. The temperature adjustment unit 625 may be realized by a computer similarly to the controller 601, or may be realized by using the same computer as the controller 601. Alternatively, the temperature adjustment unit 625 may be dedicated hardware realized by a dedicated circuit.

When receiving an instruction from controller 601, the temperature adjustment unit 625 controls the heater 626 and the refrigerant supply unit 628 to execute temperature control to bring the temperature of each device 110 of the PLP 100 placed on the placement unit 620 close to a target temperature. When realized by a computer, the temperature adjustment unit 625 may execute the temperature control by executing a temperature control program.

As an example, the temperature adjustment unit 625 also causes the heater 626 to function as a temperature sensor.

The heater 626 is a resistor that generates heat according to a flowing current, and the resistance value of the resistor changes depending on temperature. In this regard, the temperature adjustment unit 625 may stop heating by the heater 626 at the timing of measuring the temperature and cause a predetermined measurement current to flow through the heater 626. Then, the temperature adjustment unit 625 may acquire a temperature measurement value which changes according to the temperature, by measuring a potential difference generated at both ends of the heater 626 through which the measurement current flows. The temperature adjustment unit 625 may convert such a temperature measurement value into temperature data indicating a temperature (° C.).

Instead of causing the heater 626 to function as a temperature sensor, the temperature adjustment unit 625 may include a plurality of temperature sensors uniformly provided over the entire placement surface of the placement unit 620, and may acquire the temperature measurement values of the temperature sensors. The temperature sensor may be a temperature sensor using a thermal diode, a resistance temperature detector, or a thermocouple. The temperature measurement value may be a value indicating a voltage, a current, a resistance value, or the like according to the type of the temperature sensor.

The refrigerant supply unit 628 is connected to the temperature adjustment unit 625. The refrigerant supply unit 628 supplies a liquid or gas refrigerant to the refrigerant line 627, cools the refrigerant returning from the refrigerant line 627 to a temperature designated by the temperature adjustment unit 625, and circulates the refrigerant to the refrigerant line 627.

The test circuit 631 is connected to the controller 601. The test circuit 631 may include various circuits for transmitting and receiving signals to and from the device 110 to be tested to determine whether the device 110 is excellent or poor. For example, the test circuit 631 may include at least one of a site controller which controls each unit in the test circuit 631 by executing a test program, a pattern generator which generates a test pattern, a timing generator that generates a timing, a waveform shaper which shapes the test pattern by using the timing generated by the timing generator and outputs a test signal, a driver circuit which amplifies the test signal and outputs the test signal to the device 110 to be tested, a comparator which compares, with a target value, a response signal from the device 110 to be tested, or a determiner which determines whether the device 110 to be tested is excellent or poor by using a comparison result by the comparator.

The test circuit 631 has a plurality of terminals 632. Each terminal 632 of the test circuit 631 is electrically connected to each contact 642 of the contactor 640 via a signal cable. Each contact 642 of the contactor 640 may be, for example, a coaxial pogo pin. Each contact 642 has one end electrically connected to each terminal 632 of the test circuit 631 and the other end in contact with the plurality of pads 170 of the PLP 100. Accordingly, each contact 642 electrically connects each terminal 632 of the test circuit 631 and each pad 170 of the PLP 100. That is, each contact 642 electrically connects each terminal 632 of the test circuit 631 to the device 110 connected to the pad 170.

The BI test apparatus 600 described above is an apparatus illustrated as an example of the configuration of the test apparatus, and there are various variations in the function, structure, and arrangement of each unit. In addition, depending on the content of the operation test to be executed, the BI test apparatus 600 may not have a part of the configuration or may have an additional configuration.

Figure 8:
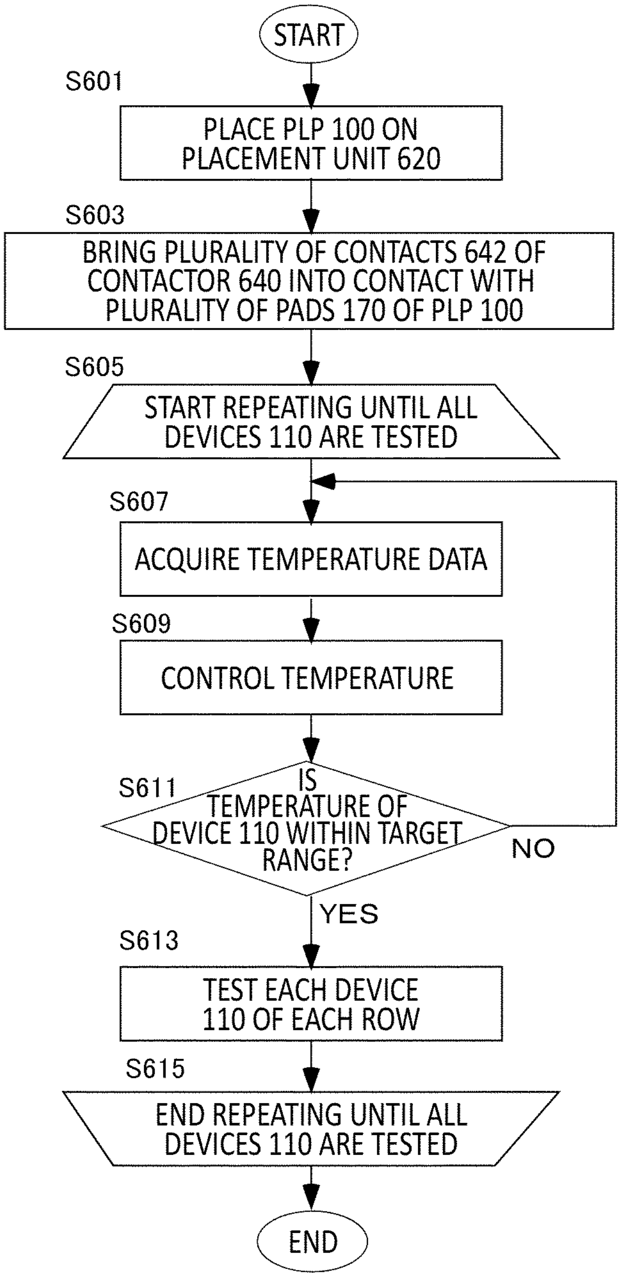
FIG. 8 illustrates an example of an operation flow of the BI test apparatus 600.

FIG. 8 illustrates an example of an operation flow of the BI test apparatus 600. The flow of FIG. 8 corresponds to the details of S109 in the flow of FIG. 1.

In S601, the BI test apparatus 600 places the PLP 100 on the placement unit 620 in the heating furnace of the BI test apparatus 600. When a state becomes such that the BI test of the next PLP 100 can be started, the controller 601 instructs the conveyance unit 605 to place the PLP 100 on the placement unit 620.

In S603, the BI test apparatus 600 brings the plurality of contacts 642 of the contactor 640 into contact with the plurality of pads 170 of the PLP 100. More specifically, when receiving an instruction from the controller 601, the placement unit 620 in the BI test apparatus 600 moves in the XY direction such that each of the plurality of pads 170 is positioned immediately below the corresponding contact 642, and then moves (rises in the example of FIG. 7) in the Z direction toward the contact 642, thereby bringing each pad 170 into contact with each contact 642.

The BI test apparatus 600 repeats the BI test processing from S605 to S615 until the BI tests of all the devices 110 formed in the PLP 100 are completed. In the BI test, a large number of devices 110 need to be subjected to the BI test simultaneously. As described above, the plurality of devices 110 in the PLP 100 are arranged in a matrix on the PLP 100. The test circuit 631 of the BI test apparatus 600 causes a signal to flow from one side of the PLP 100 in the row direction to a set of devices 110 arranged in the row direction of the matrix through the terminal 632, the contact 642, and the pad 170 in order. Accordingly, the test circuit 631 collectively performs the functional test on the plurality of devices 110 included in the set.

When the plurality of devices 110 formed in the PLP 100 are arranged in a matrix of N rows×M columns, the test circuit 631 may perform the functional test on all the devices 110 in the PLP 100 collectively by causing signals to flow simultaneously to all N rows of sets of devices 110 in the PLP 100. In this case, the above-described BI test processing is performed once. The test circuit 631 may perform the functional test on all devices 110 in the PLP 100 by causing signals to sequentially flow through each set in PLP 100. In this case, the BI test processing is repeated N times. Note that the test circuit 631 may perform the functional test at a low speed of, for example, about 10 MHz.

In step S607, the temperature adjustment unit 625 receives an instruction from the controller 601, stops heating by the heater 626, and measures a potential difference generated between both ends of the heater 626 through which a predetermined measurement current flows, thereby acquiring a temperature measurement value in the placement surface of the placement unit 620.

In step S609, when receiving an instruction from the controller 601, the temperature adjustment unit 625 controls the heater 626 and the refrigerant supply unit 628, and executes temperature control to bring the temperature of each device 110 of the PLP 100 placed on the placement unit 620 close to the target temperature. The temperature adjustment unit 625 may control the heater 626 and the refrigerant supply unit 628 to execute the temperature control such that the temperature of the surface of the PLP 100 on the placement unit 620 side is brought uniformly close to the target temperature. The target temperature is determined in advance according to the specification of the test executed by the BI test apparatus 600. When receiving an instruction from the controller 601, the temperature adjustment unit 625 may set the target temperature.

In the present embodiment, the temperature adjustment unit 625 controls the amount of heat generated by the heater 626 by adjusting the magnitude of the current flowing through the heater 626. The temperature of the placement surface of the placement unit 620 increases as the amount of heat generated by the heater 626 increases. In the present embodiment, the refrigerant supply unit 628 uniformly cools the entire placement surface of the placement unit 620. Therefore, the temperature of the placement surface of the placement unit 620 decreases when the amount of heat generated by the heater 626 becomes smaller than the amount of heat dissipated by cooling. The refrigerant supply unit 628 may set the temperature of the refrigerant supplied to the refrigerant line 627 to a predetermined temperature. Alternatively, the temperature adjustment unit 625 may set, in the refrigerant supply unit 628, the temperature of the refrigerant supplied from the refrigerant supply unit 628 to the refrigerant line 627.

In S611, the controller 601 determines whether the temperature indicated by the temperature data based on the temperature measurement value input from the temperature adjustment unit 625 is within a target range that is a range of target temperature±allowable error. When the temperature indicated by the temperature data is not within the target range, the controller 601 advances the processing to S607 to continue the temperature adjustment of the device 110 by the temperature adjustment unit 625. When the temperature indicated by the temperature data is within the target range, the controller 601 advances the processing to S613.

In S613, the BI test apparatus 600 performs the BI test on each device 110 of the PLP 100 in a state where the PLP 100 is placed on the placement unit 620 in the heating furnace. The BI test apparatus 600 may identify each of the plurality of devices 110 and determine a non-defective product/defective product for each device 110. The BI test apparatus 600 completes the BI test of the PLP 100 in response to completion of the BI test processing from S605 to S615 for all the devices 110. Note that the BI test apparatus 600 may perform the BI test of the plurality of devices 110 of the PLP 100 under a plurality of different temperature conditions by controlling the heater 626 and the refrigerant supply unit 628.

As a comparative example with the test method according to the present embodiment, a BI test using a burn-in board (BIB) is conceivable. In the comparative example, a plurality of singulated devices are picked up and placed in a matrix on the BIB. In the BIB, a socket is provided at each position where the plurality of devices is arranged, and each device placed on the BIB is connected to each socket.

In the comparative example, the BIB on which the device is placed is heated in the heating furnace of the BI test apparatus, but the socket described above is heated together with the device in the heating furnace. A plurality of devices on the BIB are picked up from the BIB when the BI test ends. The BIB of the comparative example is repeatedly used in such BI tests. Thus, in the comparative example, every time the BIB is used in the BI test, the socket of the BIB is heated together with the device in the BI test apparatus. As a result, in the comparative example, the socket of the BIB is significantly deteriorated, and when the socket cannot be used, replacement needs to be performed for each BIB. Since the BIB is considerably expensive, the cost increases in the BI test of the comparative example.

On the other hand, the test method according to the present embodiment includes: placing, on the placement unit 620, the PLP 100 in which the plurality of unsingulated devices 110 are formed in a matrix; bringing the plurality of contacts 642 electrically connected to the plurality of terminals 632 of the test circuit 631 into contact with the plurality of pads 170 provided on one side in the PLP 100 in the row direction of the matrix and connected via the plurality of lead-out wirings 131 to the internal circuit of each device 110 in each row among the plurality of devices 110, respectively; and testing, by the test circuit 631, each device 110 in each row electrically connected via the plurality of contacts 642. In the test method according to the present embodiment, each device 110 of each row may be subjected to the BI test in a state where the PLP 100 is placed on the placement unit 620 in the heating furnace of the BI test apparatus 600.

As described above, according to the test method of the present embodiment, when the BI test is performed, while maintaining the state of the PLP 100, the plurality of unsingulated devices 110 in the PLP 100 are tested without using the BIB. Unlike the BIB, the PLP 100 is not repeatedly heated for each BI test. Therefore, according to the test method of the present embodiment, it is possible to avoid the problem of increasing the cost of BIB replacement in the above-described comparative example. In addition, according to the test method of the present embodiment, it is possible to omit the process of picking up each singulated device and placing the device on the BIB in the above-described comparative example. Thus, according to the test method of the present embodiment, test time can be significantly shortened as compared with the comparative example. Thus, these advantageous effects are also obtained by the manufacturing method including the test method of the present embodiment.

Figure 9:
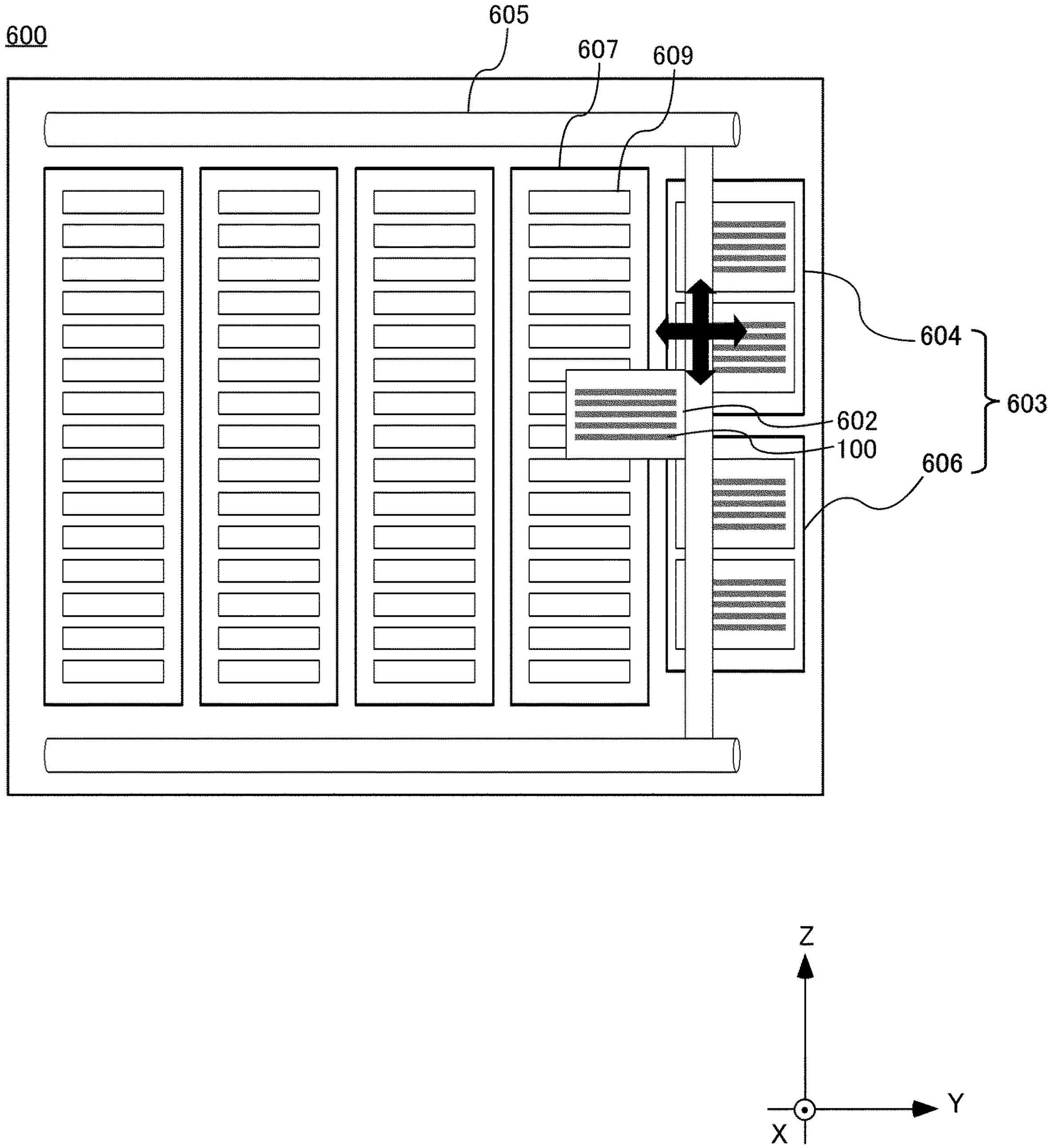
FIG. 9 is a schematic view of an appearance of an example of the BI test apparatus 600.

FIG. 9 is a schematic view of an appearance of an example of the BI test apparatus 600. As an example, the BI test apparatus 600 further includes a panel cassette 602, a stocker 603, and a test site 607 including a plurality of slots 609. The conveyance unit 605 illustrated in FIG. 9 corresponds to the conveyance unit 605 illustrated in FIG. 7. The slot 609 corresponds to the heating furnace described above, and the panel cassette 602 and the stocker 603 are outside the heating furnace.

The panel cassette 602 is a box which accommodates a plurality of PLPs 100. The stocker 603 is a shelf which stocks each panel cassette 602 before and after the PLPs 100 accommodated in the panel cassette 602 are subjected to the BI test. The stocker 603 includes a soaking unit 604 and an unsoaking unit 606.

The soaking unit 604 accommodates one or more panel cassettes 602 accommodating the object to be subjected to the BI test, that is, the PLP 100 before the BI test. The soaking unit 604 heats the PLP 100 to a predetermined temperature before the PLP 100 is subjected to the BI test. The predetermined temperature may be lower than the above-described target temperature when each device 110 of the PLP 100 is heated. As a specific example, the soaking unit 604 may have a chamber structure, and the BI test apparatus 600 may preheat the PLP 100 to the predetermined temperature by sending hot air into the soaking unit 604 of the chamber structure. As described above, according to the BI test apparatus 600, a time until the temperature of each device 110 of the PLP 100 in the BI test is brought close to the above-described target temperature can be shortened by heating the PLP 100 before the BI test.

The unsoaking unit 606 accommodates one or more panel cassettes 602 accommodating the PLP 100 after the BI test. After the PLP 100 is subjected to the BI test, the unsoaking unit 606 cools the PLP 100 to a predetermined temperature. The predetermined temperature may be a normal temperature, and in this case, the unsoaking unit 606 may naturally air-cool the PLP 100. As described above, according to the BI test apparatus 600, a time for the PLP 100 from the completion of the BI test to the start of the next process can be shortened by cooling the PLP 100 before the PLP 100 after the BI test is used in the next process, for example, by returning the PLP to a normal temperature.

The conveyance unit 605 is movable in each of the Y-axis direction and the Z-axis direction while holding the panel cassette 602. The conveyance unit 605 carries out each panel cassette 602 accommodating the PLP 100 to be subjected to the BI test from the soaking unit 604 of the stocker 603, moves the panel cassette 602 to the front of the slot 609 of a predetermined test site 607, takes out the target PLP 100 from the panel cassette 602, and carries the PLP into the slot 609.

When the PLP 100 is carried into the slot 609, the conveyance unit 605 places the PLP 100 on the placement unit 620 in the slot 609. More specifically, the conveyance unit 605 inserts the PLP 100 into the slot 609 from the card edge side provided with the plurality of pads 170, and places the PLP 100 on the placement unit 620 without changing the direction of the PLP.

The conveyance unit 605 also carries out the PLP 100 after the BI test from the slot 609 of the test site 607, accommodates the PLP in the panel cassette 602, moves the panel cassette to the front of the stocker 603, and carries each panel cassette 602 into the unsoaking unit 606 of the stocker 603.

Each of the plurality of slots 609 of the test site 607 corresponds to the heating furnace described above. In the plurality of slots 609, the PLPs 100 may be subjected to the BI test asynchronously with each other. The test time of the BI test in each slot 609 may vary depending on the number of defectives or the failure rate of the devices 110 formed in the PLP 100 carried into each slot 609. If the entire test site 607 has one chamber structure, unless all the BI tests of the plurality of PLPs 100 in the test site 607 are completed, each PLP 100 cannot be carried out from the test site 607, and unnecessary standby time occurs. On the other hand, according to the BI test apparatus 600 of the present embodiment, each slot 609 operates independently of other slots 609, that is, the PLPs 100 are subjected to the BI test asynchronously. Specifically, in each of the heating furnaces in the plurality of slots 609, upon completion of the BI test of one PLP 100, the BI test apparatus 600 switches to the BI test of another PLP 100. More specifically, the BI test apparatus 600 carries out each of the plurality of PLPs 100 in the test site 607 from each slot 609 upon completion of the BI test, and in order from the slot 609 from which the PLP 100 is carried out, carries the next PLP 100 in to start the BI test. Therefore, according to the BI test apparatus 600 of the present embodiment, it is possible to avoid that unnecessary standby time occurs.

Figure 10:
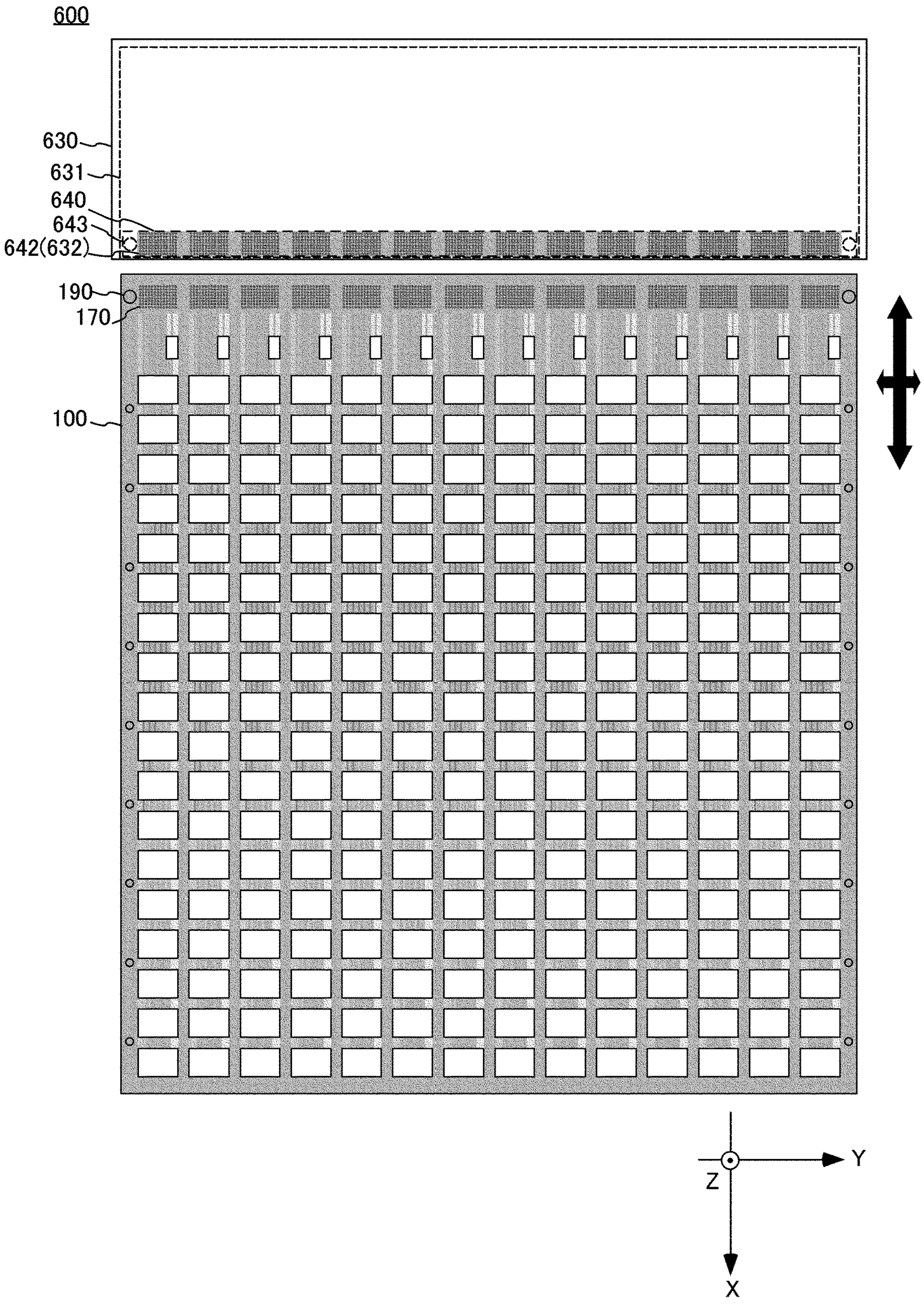
FIG. 10 is a schematic plan view for explaining a method of bringing a contact 642 of a contactor 640 into contact with a pad 170 of the PLP 100 in an example of the BI test apparatus 600.
Figure 11:
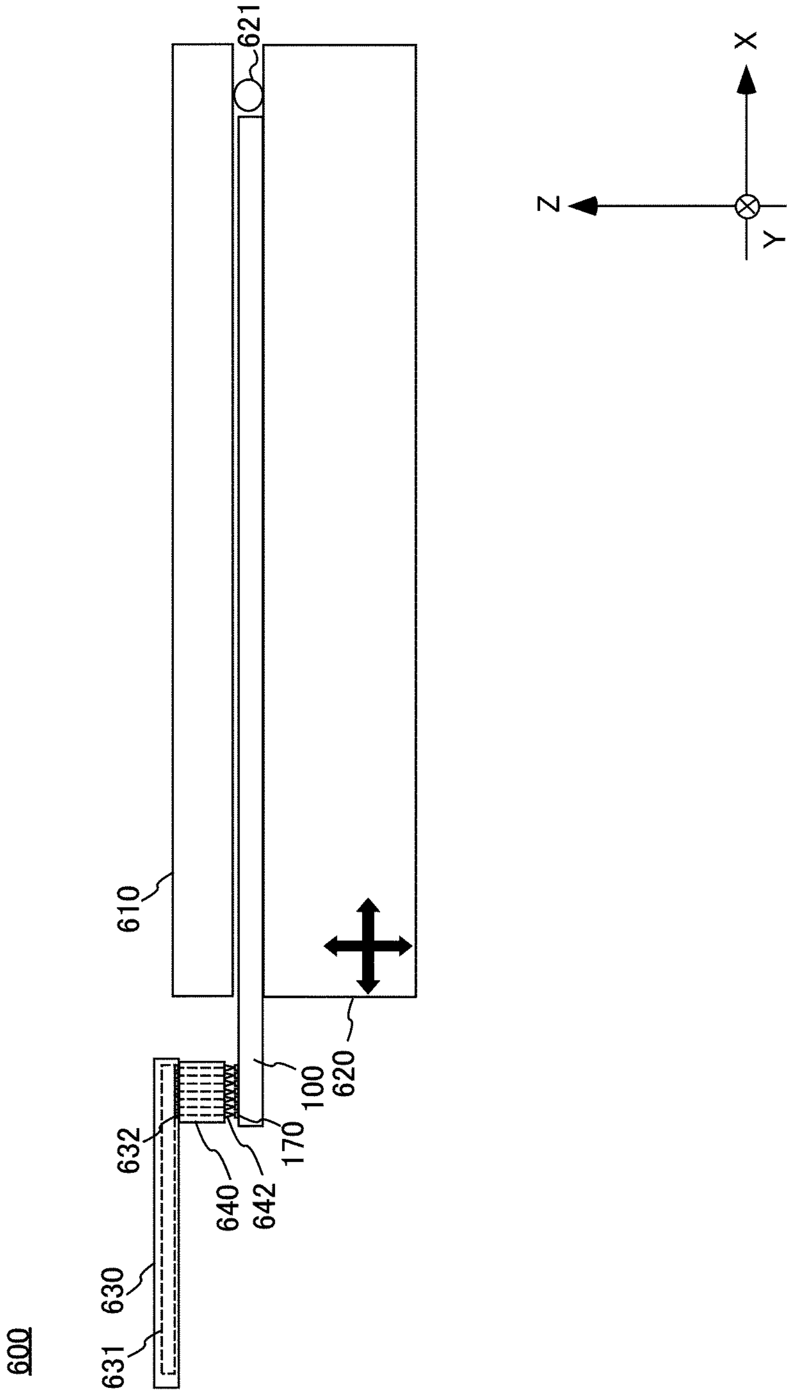
FIG. 11 is a schematic side view for explaining the method of bringing the contact 642 of the contactor 640 into contact with the pad 170 of the PLP 100 in an example of the BI test apparatus 600.

FIG. 10 is a schematic plan view for explaining a method of bringing the contact 642 of the contactor 640 into contact with the pad 170 of the PLP 100 in an example of the BI test apparatus 600, and FIG. 11 is a schematic side view corresponding to FIG. 10. In FIGS. 10 and 11, the test circuit 631 of the test board 630 is indicated by a broken line.

The contactor 640 of the BI test apparatus 600 may have a positioning member 643 corresponding to the positioning member 190 of the PLP 100. The positioning member 643 may be a pin, for example, when the positioning member 190 of the PLP 100 is a hole.

The PLP 100 is inserted into the heating furnace of the BI test apparatus 600 from the card edge side provided with the plurality of pads 170 from the X-axis positive direction toward the X-axis negative direction, and is placed on the placement unit 620 in the heating furnace in such a direction. When receiving an instruction from the controller 601, the placement unit 620 may move in the XYZ-axis direction while sucking and holding the PLP 100, and position the contactor 640 and the PLP 100 by using the positioning member 190 of the PLP 100 and the positioning member 643 of the contactor 640. After positioning the contactors 640 and the PLP 100, the placement unit 620 may bring the plurality of contacts 642 of the contactors 640 fixed to the Z-axis positive direction side of the placement unit 620 into contact with the plurality of pads 170 provided on the card edge of the PLP 100 on the X-axis negative direction side, respectively.

Figure 12:
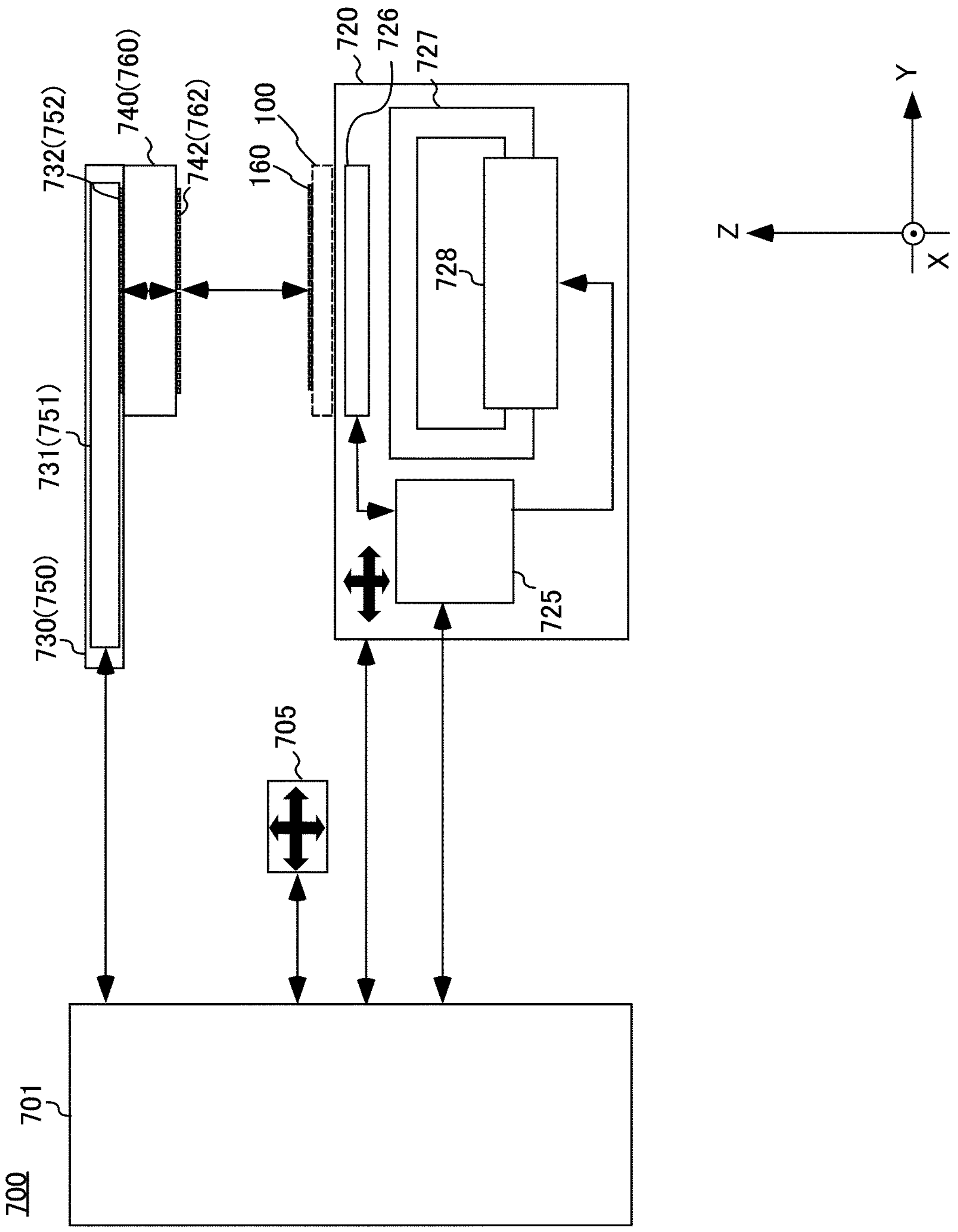
FIG. 12 is a block diagram of an example of an FT apparatus 700 which performs FT on the plurality of unsingulated devices 110 in the PLP 100.

FIG. 12 is a block diagram of an example of the FT apparatus 700 which performs FT on the plurality of unsingulated devices 110 in the PLP 100. In FIG. 12, the PLP 100 accommodated in the FT apparatus 700 is indicated by a broken line.

The FT apparatus 700 includes a controller 701, a conveyance unit 705, a placement unit 720, a temperature adjustment unit 725, a heater 726, a refrigerant supply unit 728, a refrigerant line 727, a first contactor 740, a first test board 730, and a first test circuit 731.

The controller 701 controls each unit in the FT apparatus 700 in order to perform an operation test of each device 110 under a predetermined temperature condition. In the present embodiment, the controller 701 is provided in a housing provided with the first test board 730 or the like or a housing separate from the placement unit 720, but may be provided in the same housing as that of the first test board 730 or the like or the placement unit 720.

The controller 701 may be a control computer, a workstation, a server computer, a general-purpose computer, or a computer such as a personal computer (PC). The controller 701 may be a computer system to which a plurality of computers is connected. Such a computer system is also a computer in a broad sense. In addition, the controller 701 may also be implemented by one or more virtual computer environments executable in a computer. Alternatively, the controller 701 may be a dedicated computer designed for operation test of the device, or may be dedicated hardware realized by a dedicated circuit.

The controller 701 instructs the conveyance unit 705 to place the PLP 100 before the FT test on the placement unit 720 of the FT apparatus 700 and to carry out the PLP 100 subjected to the FT test from the placement unit 720.

The controller 701 also controls the operation test of each device 110 in the PLP 100. When realized by a computer, the controller 701 may control the operation test of each device 110 by executing a test control program. The controller 701 instructs the placement unit 720 to suck and hold the PLP 100 placed on the placement surface and to bring a plurality of sacrificial pads 160 formed on the plurality of devices 110 of the PLP 100 into contact with a plurality of contacts 742 of the first contactor 740 collectively.

The controller 701 gives an instruction of the temperature condition of the operation test to the temperature adjustment unit 725 and causes the temperature adjustment unit 725 to adjust the temperature of the device 110 of the PLP 100. The controller 701 supplies a test program to the first test circuit 731 in the first test board 730 and causes the first test circuit 731 to execute the test program. The controller 701 collects and records the test results of each device 110.

When receiving an instruction from controller 701, the placement unit 720 sucks and holds the PLP 100 on the placement surface. The placement unit 720 according to the present embodiment may have a vacuum chuck, an electrostatic chuck, or the like. In addition, the heater 726 and the refrigerant line 727 are provided on the placement unit 720 such that the placement surface on which the PLP 100 is placed can be uniformly heated and cooled.

The placement unit 720 movably supports the PLP 100. The placement unit 720 may be movable along the PLP 100 in the XYZ directions. The placement unit 720 may be capable of rotating the PLP 100 about a vertical axis perpendicular to the upper surface of the PLP 100. When receiving an instruction from the controller 701, the placement unit 720 moves the PLP 100 to bring the plurality of sacrificial pads 160, which are formed on the plurality of devices 110 of the PLP 100 placed on the placement surface, into collective contact with the plurality of contacts 742 of the first contactor 740 fixed to the Z-axis positive direction side of the placement unit 720.

The temperature adjustment unit 725 is provided on the placement unit 720 and is connected to the controller 701. The temperature adjustment unit 725 may be realized by a computer similarly to the controller 701, or may be realized by using the same computer as the controller 701. Alternatively, the temperature adjustment unit 725 may be dedicated hardware realized by a dedicated circuit.

When receiving an instruction from controller 701, the temperature adjustment unit 725 controls the heater 726 and the refrigerant supply unit 728 to execute temperature control to bring the temperature of each device 110 of the PLP 100 placed on the placement unit 720 close to a target temperature. When realized by a computer, the temperature adjustment unit 725 may execute the temperature control by executing a temperature control program.

As an example, the temperature adjustment unit 725 also causes the heater 726 to function as a temperature sensor. The temperature adjustment unit 725 may stop heating by the heater 726 at the timing of measuring the temperature and cause a predetermined measurement current to flow through the heater 726. Then, the temperature adjustment unit 725 may acquire a temperature measurement value which changes according to the temperature, by measuring a potential difference generated at both ends of the heater 726 through which the measurement current flows. The temperature adjustment unit 725 may convert such a temperature measurement value into temperature data indicating a temperature (° C.).

Instead of causing the heater 726 to function as a temperature sensor, the temperature adjustment unit 725 may include a plurality of temperature sensors uniformly provided over the entire placement surface of the placement unit 720, and may acquire the temperature measurement values of the temperature sensors. The temperature sensor may be a temperature sensor using a thermal diode, a resistance temperature detector, or a thermocouple. The temperature measurement value may be a value indicating a voltage, a current, a resistance value, or the like according to the type of the temperature sensor.

The refrigerant supply unit 728 is connected to the temperature adjustment unit 725. The refrigerant supply unit 728 supplies a liquid or gas refrigerant to the refrigerant line 727, cools the refrigerant returning from the refrigerant line 727 to a temperature designated by the temperature adjustment unit 725, and circulates the refrigerant to the refrigerant line 727.

The first test circuit 731 is connected to the controller 701. The first test circuit 731 may include various circuits for transmitting and receiving signals to and from the device 110 to be tested to determine whether the device 110 is excellent or poor. For example, the first test circuit 731 may include at least one of a site controller which controls each unit in the first test circuit 731 by executing a test program, a pattern generator which generates a test pattern, a timing generator that generates a timing, a waveform shaper which shapes the test pattern by using the timing generated by the timing generator and outputs a test signal, a driver circuit which amplifies the test signal and outputs the test signal to the device 110 to be tested, a comparator which compares, with a target value, a response signal from the device 110 to be tested, or a determiner which determines whether the device 110 to be tested is excellent or poor by using a comparison result by the comparator.

The first test circuit 731 includes a plurality of terminals 732. Each terminal 732 of the first test circuit 731 is electrically connected to each contact 742 of the first contactor 740 via a signal cable. Each contactor 742 of the contactor has one end electrically connected to each terminal 732 of the first test circuit 731 and the other end in contact with the plurality of sacrificial pads 160 of the PLP 100. Accordingly, each contact 742 electrically connects each terminal 732 of the first test circuit 731 and each sacrificial pad 160 of the PLP 100. That is, each contact 742 electrically connects each terminal 732 of the first test circuit 731 to the device 110 connected to the sacrificial pad 160.

The FT apparatus 700 described above is an apparatus illustrated as an example of the configuration of the test apparatus, and there are various variations in the function, structure, and arrangement of each unit. In addition, depending on the content of the operation test to be executed, the FT apparatus 700 may not have a part of the configuration or may have an additional configuration.

Figure 13:
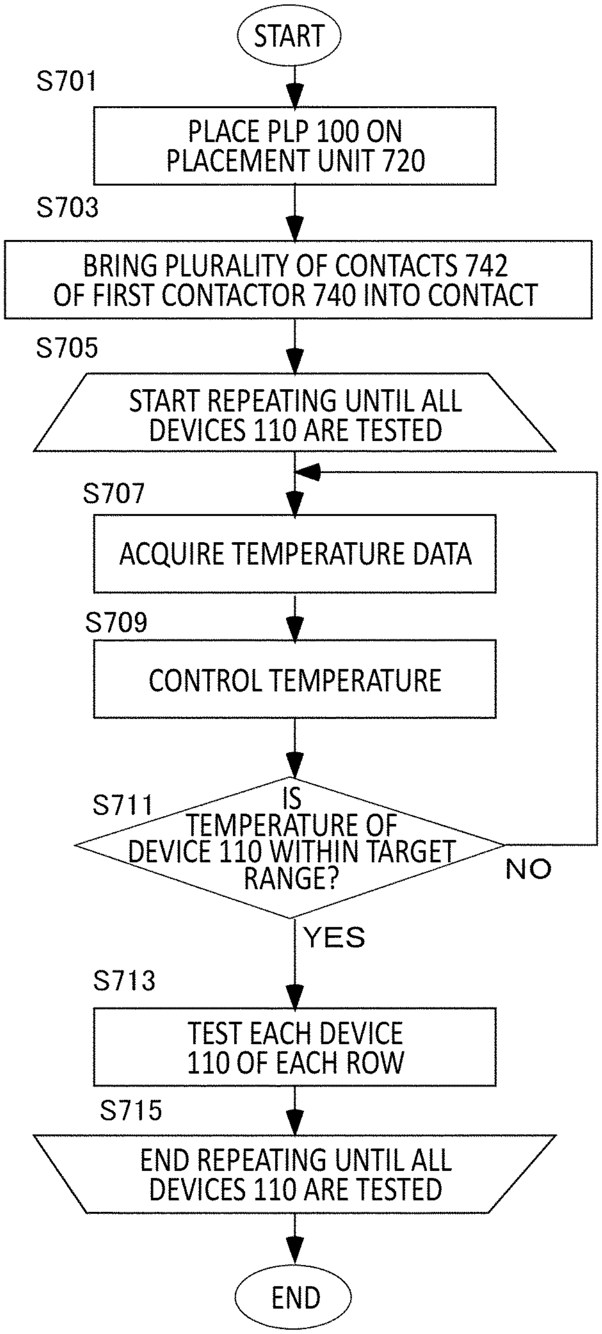
FIG. 13 illustrates an example of an operation flow of the FT apparatus 700.

FIG. 13 illustrates an example of an operation flow of the FT apparatus 700. The flow of FIG. 13 corresponds to the details of S111 in the flow of FIG. 1.

In S701, the FT apparatus 700 places the PLP 100 on the placement unit 720 of the FT apparatus 700. When a state becomes such that the FT of the next PLP 100 can be started, the controller 701 instructs the conveyance unit 705 to place the PLP 100 on the placement unit 720.

In step S703, the FT apparatus 700 brings the plurality of contact points 742 of the first contactor 740 into contact with the plurality of sacrificial pads 160 of the PLP 100. More specifically, when receiving an instruction from the controller 701, the placement unit 720 in the FT apparatus 700 moves in the XY direction such that each of the plurality of sacrificial pads 160 is positioned immediately below the corresponding contact 742, and then moves (rises in the example of FIG. 12) in the Z direction toward the contact 742, thereby bringing each sacrificial pad 160 into contact with each contact 742.

The FT apparatus 700 repeats the FT processing from S705 to S715 until the FT of all the devices 110 formed in the PLP 100 is completed. When the PLP 100 has N devices 110 and the first test circuit 731 of the FT apparatus 700 can perform the FT on only one device 110 simultaneously, the first test circuit 731 repeats the FT test processing of each device 110 N times. When the first test circuit 731 of the FT apparatus 700 can test K (2, 4, or the like) devices 110 simultaneously, the first test circuit 731 may repeat the FT test processing of K devices 110 N/K times. Accordingly, the first test circuit 731 executes the FT for individually confirming the operations of the plurality of devices 110.

In step S707, the temperature adjustment unit 725 receives an instruction from the controller 701, stops heating by the heater 726, and measures a potential difference generated between both ends of the heater 726 through which a predetermined measurement current flows, thereby acquiring a temperature measurement value in the placement surface of the placement unit 720.

In step S709, when receiving an instruction from the controller 701, the temperature adjustment unit 725 controls the heater 726 and the refrigerant supply unit 728, and executes temperature control to bring the temperature of each device 110 of the PLP 100 placed on the placement unit 720 close to the target temperature. The temperature adjustment unit 725 may control the heater 726 and the refrigerant supply unit 728 to execute the temperature control such that the temperature of the surface of the PLP 100 on the placement unit 720 side is brought uniformly close to the target temperature. The target temperature is determined in advance according to the specification of the test executed by the FT apparatus 700. When receiving an instruction from the controller 701, the temperature adjustment unit 725 may set the target temperature.

In the present embodiment, the temperature adjustment unit 725 controls the amount of heat generated by the heater 726 by adjusting the magnitude of the current flowing through the heater 726. The temperature of the placement surface of the placement unit 720 increases as the amount of heat generated by the heater 726 increases. In the present embodiment, the refrigerant supply unit 728 uniformly cools the entire placement surface of the placement unit 720. Therefore, the temperature of the placement surface of the placement unit 720 decreases when the amount of heat generated by the heater 726 becomes smaller than the amount of heat dissipated by cooling. The refrigerant supply unit 728 may set the temperature of the refrigerant supplied to the refrigerant line 727 to a predetermined temperature. Alternatively, the temperature adjustment unit 725 may set, in the refrigerant supply unit 728, the temperature of the refrigerant supplied from the refrigerant supply unit 728 to the refrigerant line 727.

In S711, the controller 701 determines whether the temperature indicated by the temperature data based on the temperature measurement value input from the temperature adjustment unit 725 is within a target range that is a range of target temperature±allowable error. When the temperature indicated by the temperature data is not within the target range, the controller 701 advances the processing to S707 to continue the temperature adjustment of the device 110 by the temperature adjustment unit 725. When the temperature indicated by the temperature data is within the target range, the controller 701 advances the processing to S713.

In S713, the FT apparatus 700 performs the FT on each device 110 of the PLP 100 while the PLP 100 is placed on the placement unit 720. The FT apparatus 700 identifies each of the plurality of devices 110 and determines a non-defective product/defective product for each device 110. The FT apparatus 700 completes the FT of the PLP 100 in response to completion of the FT processing from S705 to S715 for all the devices 110.

The FT apparatus 700 may perform the FT of the plurality of devices 110 of the PLP 100 under a plurality of different temperature conditions by controlling the heater 726 and the refrigerant supply unit 728. Furthermore, the FT apparatus 700 may simultaneously perform the FT on all of the plurality of devices 110 of the PLP 100, or may divide them into several sets, simultaneously perform the FT on all of the plurality of devices 110 of each set, and sequentially perform the FT on each set.

As described above, the test method according to the present embodiment includes: placing, on the placement unit 720, the PLP 100 formed with the plurality of unsingulated devices 110; bringing at least one contact 742 electrically connected to at least one terminal 732 of the first test circuit 731 into contact with at least one terminal 110, for example, the sacrificial pad 160, of at least one device of the plurality of devices 110, respectively, the terminal being exposed on a second surface on a side opposite to the first surface on the placement unit 720 side in the PLP 100; and testing, by the first test circuit 731, the at least one device 110 electrically connected via the at least one contact 742. The test method according to the present embodiment may execute the FT in order to individually confirm the operation of at least one device 110. The test method according to the present embodiment may also execute the FT of at least one device 110 under a plurality of different temperature conditions.

As described above, according to the test method of the present embodiment, while maintaining the state of the PLP 100, the FT of the plurality of unsingulated devices 110 in the PLP 100 is performed. More specifically, the FT of each device 110 is performed by individually sending a signal to the plurality of devices 110 via the plurality of terminals of the plurality of devices 110 exposed on the front surface of the PLP 100, for example, the sacrificial pad 160. Thus, according to the test method of the present embodiment, as compared with the above-described comparative example, in addition to the above-described advantages, it is possible to omit the process of picking up each singulated device from the BIB and individually performing the FT after the BI test. Thus, according to the test method of the present embodiment, the test time can be significantly shortened as compared with the comparative example. Thus, these advantageous effects are also obtained by the manufacturing method including the test method of the present embodiment.

In addition, as described with reference to FIG. 1, according to the manufacturing method of the present embodiment, as an example, when the plurality of devices 110 in the PLP 100 are tested, no ball is mounted on each device 110, and after the test is finished, a ball is mounted on the device 110. More specifically, when the plurality of devices 110 in the PLP 100 are subjected to the Fr, the contact 742 of the first contactor 740 of the FT apparatus 700 contacts only the sacrificial pad 160 and does not contact the ball pad 150. In other words, the terminal of the device 110 with which the contact 742 is brought into contact includes the sacrificial pad 160 and does not include the ball pad 150. Then, after the Fr, the ball attaching apparatus 800 does not mount the ball on the sacrificial pad 160 with which the contact 742 is in contact, but mounts the ball only on the ball pad 150.

Thus, according to the test method of the present embodiment, it is possible to avoid a situation in which the ball is scratched by the contactor of the tester. According to the manufacturing method including the test method of the present embodiment, the device 110 on which the ball with high connection reliability is mounted can be manufactured. In addition, for example, it is possible to avoid a situation in which the contactor of the tester interferes with a ball other than the ball to be contacted and cannot contact the ball to be contacted.

Figure 14:
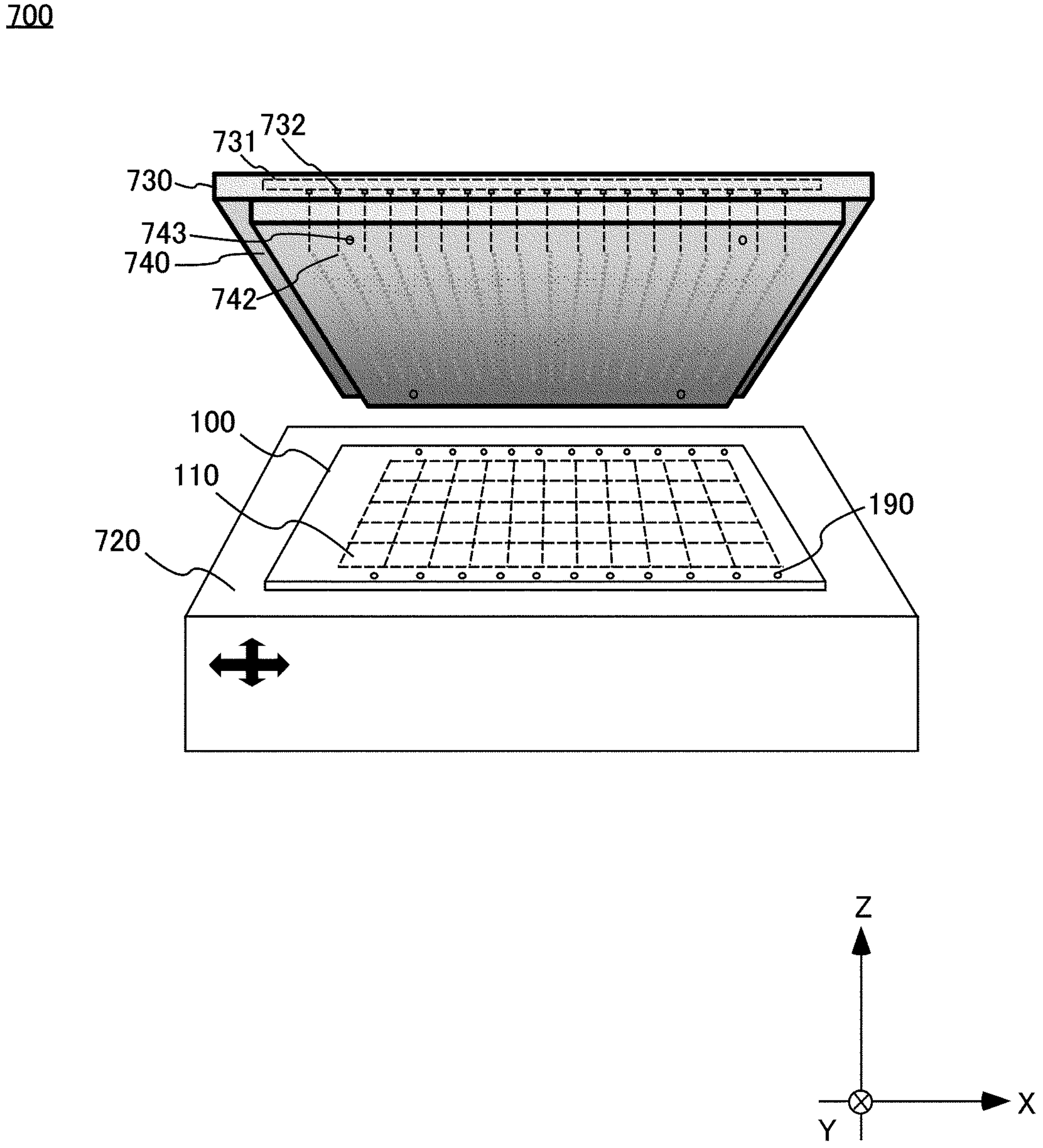
FIG. 14 is a schematic perspective view for explaining a method of bringing a contact 742 of a first contactor 740 into contact with the terminal of each device 110 of the PLP 100 in an example of the FT apparatus 700.

FIG. 14 is a schematic perspective view for explaining a method of bringing the contact 742 of the first contactor 740 into contact with the terminal of each device 110 of the PLP 100 in an example of the FT apparatus 700.

The first contactor 740 of the FT apparatus 700 may have a positioning member 743 corresponding to the positioning member 190 of the PLP 100. The positioning member 743 may be a pin, for example, when the positioning member 190 of the PLP 100 is a hole.

When receiving an instruction from the controller 701, the placement unit 720 may move in the XYZ axis direction while sucking and holding the PLP 100, and position the first contactor 740 and the PLP 100 by using the positioning member 190 of the PLP 100 and the positioning member 743 of the first contactor 740. After positioning the first contactor 740 and the PLP 100, the placement unit 720 may bring each contact 742 of the first contactor 740 fixed on the Z-axis positive direction side of the placement unit 720 into contact with the terminal of each device 110 of the PLP 100.

Figure 15:
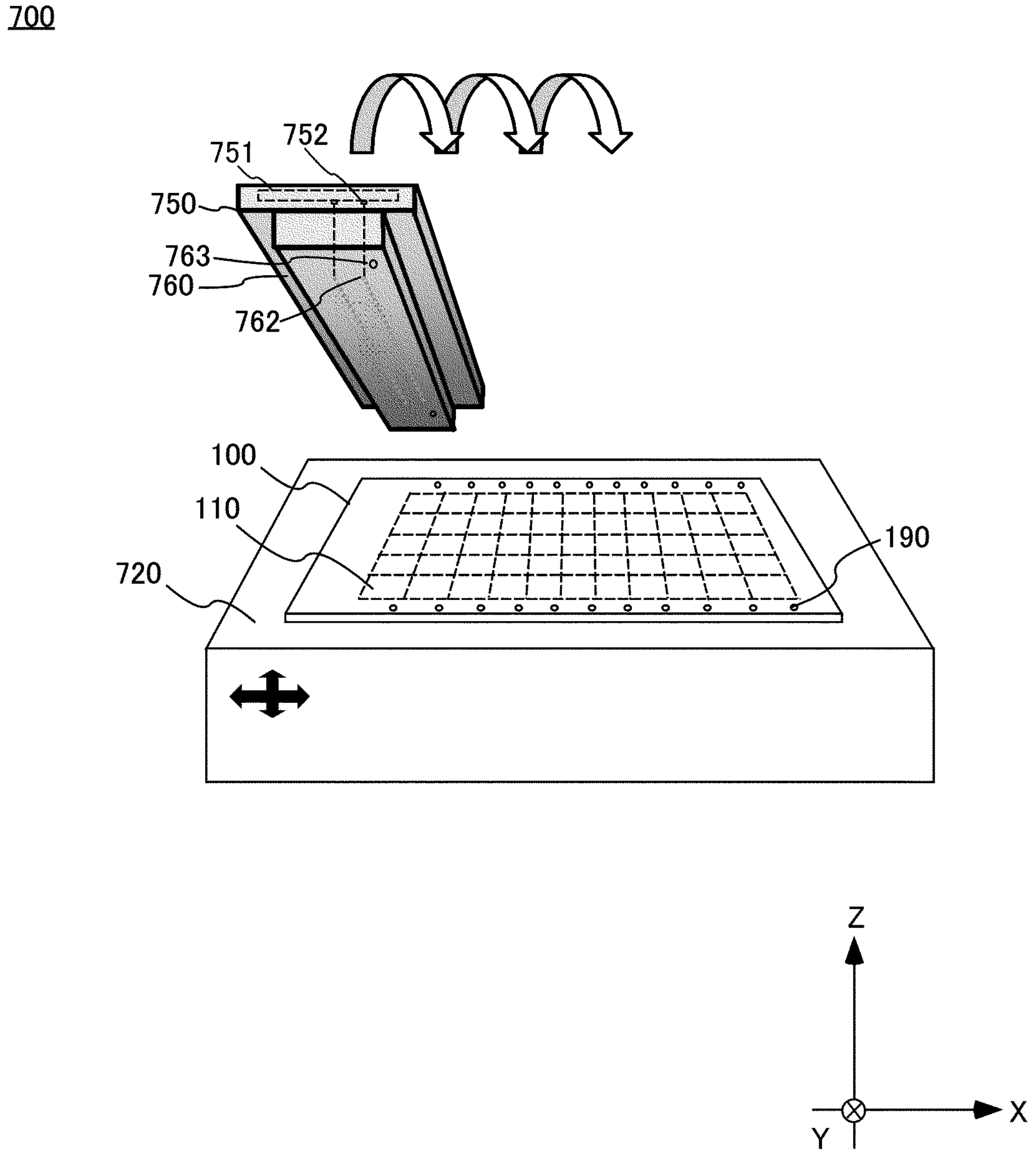
FIG. 15 is a schematic perspective view for explaining a method of bringing a contact 762 of a second contactor 760 into contact with the terminal of each device 110 of the PLP 100 in an example of the FT apparatus 700.

FIG. 15 is a schematic perspective view for explaining a method of bringing a contact 762 of a second contactor 760 into contact with the terminal of each device 110 of the PLP 100 in an example of the FT apparatus 700. In addition to or instead of the first contactor 740 and the first test board 730 including the first test circuit 731, the FT apparatus 700 may include the second contactor 760 and a second test board 750 including a second test circuit 751. The configurations of the second contactor 760 and the second test board 750 may be similar to the configurations of the first contactor 740 and the first test board 730, and redundant description will be omitted.

The number of the contacts 762 of the second contactor 760 is smaller than the number of the contacts 742 of the first contactor 740. Therefore, the number of terminals 752 of the second test circuit 751 is also smaller than the number of the terminals 732 of the first test circuit 731. The second test circuit 751 having such a configuration performs the FT of each device 110 at a relatively high test frequency as compared with the first test circuit 731. Note that the contact 762 of the second contactor 760 is a contact capable of coping with a high-speed signal, and may be, for example, a coaxial pogo pin.

After performing the FT on each device 110 by using the first test circuit 731 or the like, the FT apparatus 700 may repeatedly touch down the second contactor 760 on the PLP 100 to sequentially perform the FT on each device 110 by using the second test circuit 751 or the like, or may execute only one of these FTs. Before the second contactor 760 is touched down on the PLP 100, the placement unit 720 of the FT apparatus 700 may position the second contactor 760 and the PLP 100 by using the positioning member 190 of the PLP 100 and the positioning member 763 of the second contactor 760. After positioning the second contactor 760 and the PLP 100, the placement unit 720 may bring each contactor 762 of the second contactor 760 fixed to the Z-axis positive direction side of the placement unit 720 into contact with the terminal of each device 110 of PLP 100. Note that the FT of each device 110 using the second test circuit 751 or the like may be referred to as a PKG (PACKAGE) test.

Figure 16:
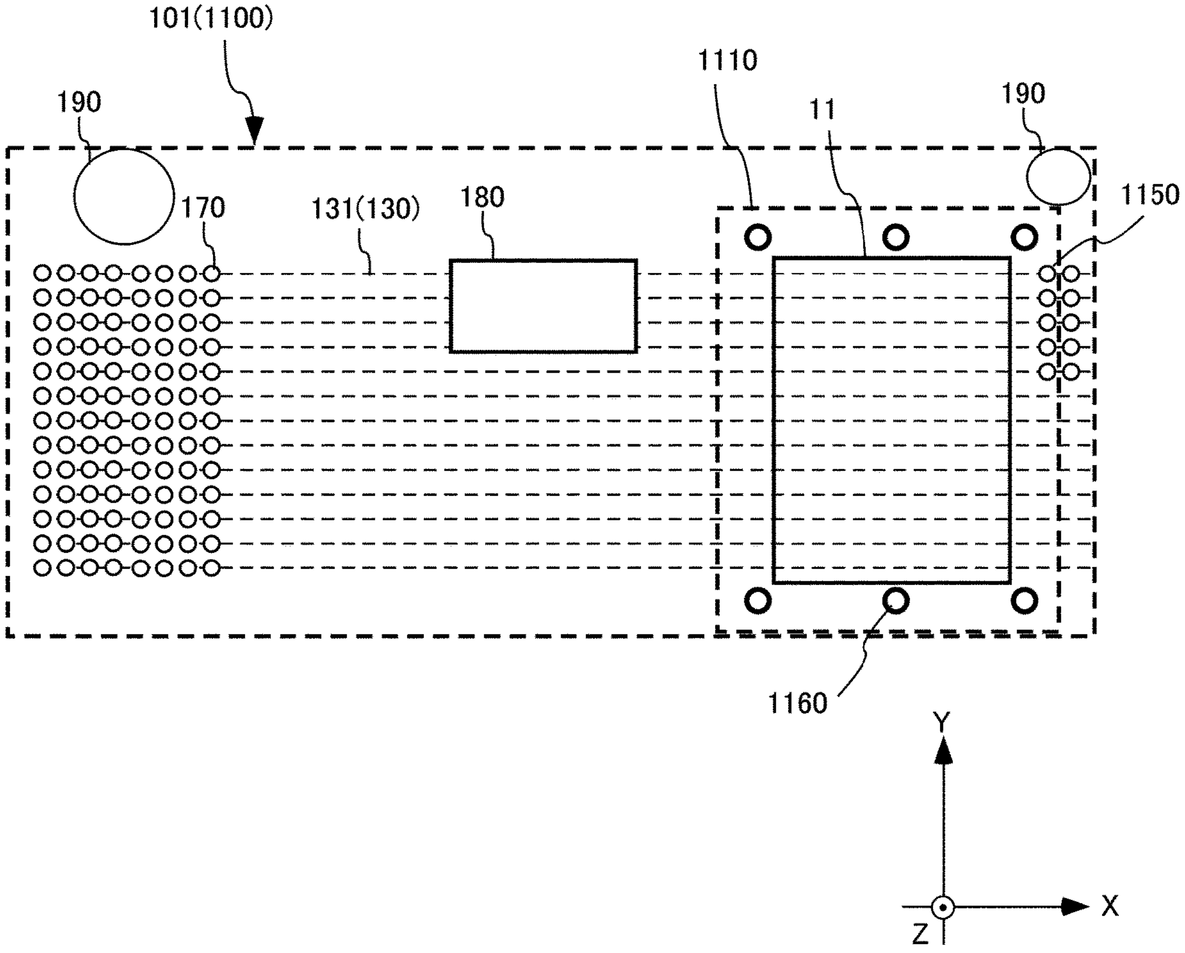
FIG. 16 is a diagram corresponding to a partially enlarged view of the region 101 in FIG. 2 in a PLP 1100 as a modification of the PLP 100.

FIG. 16 is a diagram corresponding to a partially enlarged view of the region 101 in FIG. 2 in a PLP 1100 as a modification of the PLP 100. In a device 1110 of the PLP 1100 according to the present embodiment, a test terminal 1150 and a ball 1160 exposed on the front surface of the PLP 1100 are formed instead of the ball pad 150 and the sacrificial pad 160. The test terminal 1150 is exposed from a region adjacent to each device 110. The test terminal 1150 may be, for example, a BIST pin.

The ball 1160 is formed on the device 1110. In each device 1110, the balls 1160 are formed more than the test terminals 1150. The test terminal 1150 and the ball 1160 are connected to the internal circuit of the semiconductor chip 11 via the redistribution layer 130. The test terminal 1150 and the ball 1160 are examples of at least one terminal, which is exposed on the front surface of the PLP 100, of the device 1110. Note that the test terminal 1150 may be a pin.

In the FT in the present embodiment, the first test circuit 731 or the like of the FT apparatus 700 may additionally or alternatively perform the FT test on each device 110 in a state where the contact 742 or the like of the first contactor 740 is electrically connected to the test terminal 1150 of each device 110, and then perform the FT test on each device 110 in a state where the contact 742 or the like is electrically connected to the ball 1160 of each device 110.

In the above embodiment, the BI test apparatus 600 and the FT apparatus 700 have been described as apparatuses of different housings. Alternatively, the BI test apparatus 600 and the FT apparatus 700 may be provided in one housing. For example, in the BI test apparatus 600 illustrated in FIG. 9, some test sites 607 and/or some slots 609 may be used as the FT apparatus 700.

Various embodiments of the present invention may be described with reference to flowcharts and block diagrams whose blocks may represent (1) steps of processes in which operations are performed or (2) sections of devices responsible for performing operations. Certain steps and sections may be implemented by dedicated circuitry, programmable circuitry supplied with computer-readable instructions stored on computer-readable media, and/or processors supplied with computer-readable instructions stored on computer-readable media. Dedicated circuitry may include digital and/or analog hardware circuits, and may include integrated circuits (IC) and/or discrete circuits. The programmable circuit may include a reconfigurable hardware circuit including logical AND, logical OR, logical XOR, logical NAND, logical NOR, and other logical operations, a memory element such as a flip-flop, a register, a field programmable gate array (FPGA) and a programmable logic array (PLA), and the like.

A computer-readable medium may include any tangible device that can store instructions to be executed by a suitable device, and as a result, the computer-readable medium having instructions stored thereon includes an article of manufacture including instructions which can be executed to create means for performing operations specified in the flowcharts or block diagrams. Examples of the computer-readable medium may include an electronic storage medium, a magnetic storage medium, an optical storage medium, an electromagnetic storage medium, a semiconductor storage medium, and the like. More specific examples of the computer-readable medium may include a floppy (registered trademark) disk, a diskette, a hard disk, a random access memory (RAM), a read-only memory (ROM), an erasable programmable read-only memory (EPROM or flash memory), an electrically erasable programmable read-only memory (EEPROM), a static random access memory (SRAM), a compact disc read-only memory (CD-ROM), a digital versatile disk (DVD), a Blu-ray (registered trademark) disk, a memory stick, an integrated circuit card, and the like.

The computer-readable instruction may include: an assembler instruction, an instruction-set-architecture (ISA) instruction; a machine instruction; a machine dependent instruction; a microcode; a firmware instruction; state-setting data; or either a source code or an object code written in any combination of one or more programming languages, including an object oriented programming language such as Smalltalk (registered trademark), JAVA (registered trademark), C++, or the like; and a conventional procedural programming language such as a "C" programming language or a similar programming language.

The computer-readable instructions may be provided to a processor of a general purpose computer, special purpose computer, or other programmable data processing apparatuses, or to a programmable circuit, locally or via a local area network (LAN), wide area network (WAN) such as the Internet, or the like, to execute the computer-readable instructions to create means for performing operations specified in the flowcharts or block diagrams. Examples of the processor include a computer processor, a processing unit, a microprocessor, a digital signal processor, a controller, a microcontroller, and the like.

Figure 17:
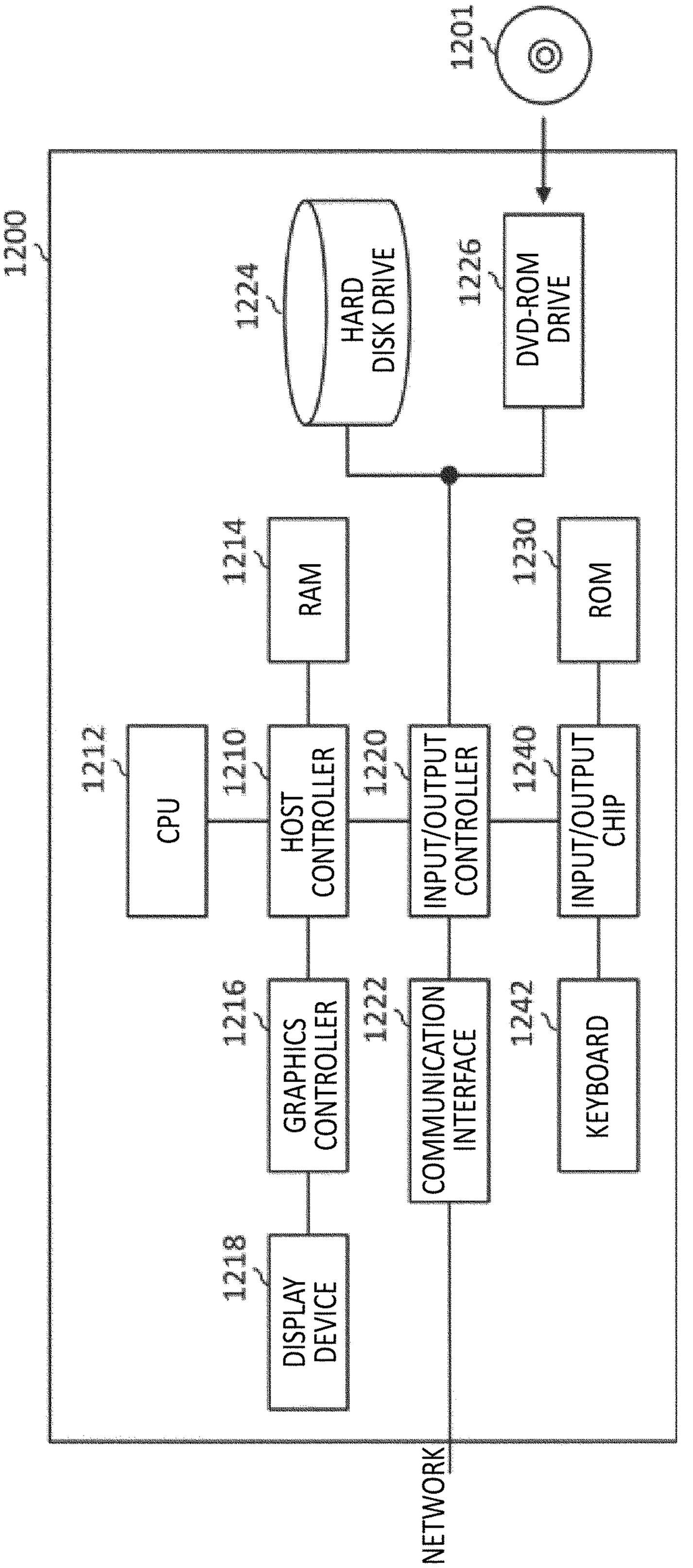
FIG. 17 illustrates an example of a computer 1200 in which a plurality of aspects of the present invention may be embodied in whole or in part.

FIG. 17 illustrates an example of a computer 1200 in which a plurality of aspects of the present invention may be embodied in whole or in part. A program installed on the computer 1200 can cause the computer 1200 to function as an operation associated with a device according to embodiments of the present invention or as one or more "unit(s)" of the device, or to perform the operation or the one or more "unit(s)", and/or can cause the computer 1200 to perform processes according to embodiments of the present invention or steps of the processes. Such a program may be executed by a CPU 1212 to cause the computer 1200 to perform particular operations associated with some or all blocks in the flowcharts or block diagrams described herein.

The computer 1200 according to the present embodiment includes a CPU 1212, a RAM 1214, a graphics controller 1216 and a display device 1218, which are connected to each other by a host controller 1210. The computer 1200 also includes input/output units such as a communication interface 1222, a hard disk drive 1224, a DVD-ROM drive 1226 and an IC card drive, which are connected to the host controller 1210 via an input/output controller 1220. The computer also includes legacy input/output units such as a ROM 1230 and a keyboard 1242, which are connected to the input/output controller 1220 via an input/output chip 1240.

The CPU 1212 operates in accordance with programs stored in the ROM 1230 and the RAM 1214, and controls each unit accordingly. The graphics controller 1216 acquires image data generated by the CPU 1212 on a frame buffer or the like provided in the RAM 1214 or in the graphics controller 1216 itself, and displays the image data on the display device 1218.

The communication interface 1222 communicates with other electronic devices via a network. The hard disk drive 1224 stores programs and data to be used by the CPU 1212 in the computer 1200. The DVD-ROM drive 1226 reads programs or data from the DVD-ROM 1201, and provides the programs or data to the hard disk drive 1224 via the RAM 1214. The IC card drive reads the program and data from the IC card, and/or writes the program and data to the IC card.

The ROM 1230 has stored therein a boot program or the like to be executed by the computer 1200 at the time of activation, and/or a program that depends on the hardware of the computer 1200. The input/output chip 1240 may also connect various input/output units to the input/output controller 1220 via a parallel port, a serial port, a keyboard port, a mouse port or the like.

Programs are provided by a computer-readable storage medium such as the DVD-ROM 1201 or an IC card. The programs are read from the computer-readable storage medium, installed on the hard disk drive 1224, the RAM 1214 or the ROM 1230, which are also examples of a computer-readable storage medium, and executed by the CPU 1212. Information processing written in these programs is read by the computer 1200, and provides cooperation between the programs and the various types of hardware resources described above. An apparatus or method may be constituted by realizing the operation or processing of information in accordance with the usage of the computer 1200.

For example, if a communication is performed between the computer 1200 and external devices, the CPU 1212 may execute a communication program loaded on the RAM 1214, and instruct the communication interface 1222 to perform communication process based on the process described in the communication program. Under the control of the CPU 1212, the communication interface 1222 reads transmission data stored in a transmission buffer region provided in a recording medium such as the RAM 1214, the hard disk drive 1224, the DVD-ROM 1201 or an IC card, and sends the read transmission data to the network, or writes reception data received from the network into a reception buffer region or the like provided in the recording medium.

The CPU 1212 may also make all or required portions of the files or databases stored in an external recording medium such as the hard disk drive 1224, the DVD-ROM drive 1226 (DVD-ROM 1201) or an IC card to be read by the RAM 1214, and execute various types of processing on the data on the RAM 1214. Then, the CPU 1212 may write the processed data back in the external recording medium.

Various types of information such as various types of programs, data, tables and databases may be stored in the recording medium for information processing. The CPU 1212 may execute, on the data read from the RAM 1214, various types of processing including various types of operations, information processing, conditional judgement, conditional branching, unconditional branching, information retrieval/replacement, or the like described throughout the present disclosure and specified by instruction sequences of the programs, to write the results back to the RAM 1214. In addition, the CPU 1212 may retrieve information in a file, a database, or the like in the recording medium. For example, when a plurality of entries, each having an attribute value of a first attribute associated with an attribute value of a second attribute, are stored in the recording medium, the CPU 1212 may search the plurality of entries for an entry whose attribute value of the first attribute matches a designated condition, read the attribute value of the second attribute stored in the entry, and thereby acquire the attribute value of the second attribute associated with the first attribute that meets a predetermined condition.

The programs or software modules in the above description may be stored on the computer 1200 or a computer-readable storage medium near the computer 1200. Further, a recording medium such as a hard disk or a RAM provided in a server system connected to a dedicated communication network or the Internet can be used as a computer-readable storage media, which provides programs to the computer 1200 via the network.

While the present invention has been described with the embodiments, the technical scope of the present invention is not limited to the above described embodiments. It is apparent to persons skilled in the art that various alterations and improvements can be added to the above-described embodiments. It is also apparent from the description of the claims that the embodiments to which such alterations or improvements are made can be included in the technical scope of the present invention.

The operations, procedures, steps, and stages of each process performed by an apparatus, system, program, and method shown in the claims, specification, or drawings can be performed in any order as long as the order is not indicated by "prior to," "before," or the like and as long as the output from a previous process is not used in a later process. Even if the process flow is described using phrases such as "first" or "next" in the claims, specification, or drawings, it does not necessarily mean that the process must be performed in this order.

EXPLANATION OF REFERENCES

10: wafer; 11: semiconductor chip; 100, 1100: PLP; 101: region; 110, 1110: device; 120: substrate; 123 supply completion position; 125: non-supply position; 130: redistribution layer; 131: lead-out wiring; 140: sealing portion; 150: ball pad; 160: sacrificial pad; 170: pad; 180: fuse; 190: positioning member; 200: first preliminary FT apparatus; 300: singulating apparatus; 400: second preliminary FT apparatus; 410: test apparatus; 420: contactor; 430: slider; 500: PLP forming apparatus; 510: conveyance table; 520: adhesive supply unit; 530: first slider; 540: chip arrangement unit; 550: second slider; 600: BI test apparatus; 601: controller; 602: panel cassette; 603: stocker; 604: soaking unit; 606: unsoaking unit; 605: conveyance unit; 607: test site; 609: slot; 610: cap; 611: cap holding unit; 620: placement unit; 621: sealing member; 625: temperature adjustment unit; 626: heater; 627: refrigerant line; 628: refrigerant supply unit; 630: test board; 631: test circuit; 632: terminal; 640: contactor; 642: contact; 643: positioning member; 700: FT apparatus; 701: controller; 705: conveyance unit; 720: placement unit; 725: temperature adjustment unit; 726: heater; 727: refrigerant line; 728: refrigerant supply unit; 730: first test board; 731: test circuit; 732: terminal; 740: first contactor; 742: contact; 743: positioning member; 750: second test board; 751: test circuit; 752: terminal; 760: second contactor; 762: contact; 763: positioning member; 800: ball attaching apparatus; 900: selection apparatus; 1150: test terminal; 1160: ball; 1200: computer; 1201: DVD-ROM; 1210: host controller; 1212: CPU; 1214: RAM; 1216: graphic controller; 1218: display device; 1220: input/output controller; 1222: communication interface; 1224: hard disk drive; 1226: DVD-ROM drive; 1230: ROM; 1240: input/output chip; and 1242: keyboard

What is claimed is:

1. A test method comprising:

placing, on a placement unit, a panel level package in which a plurality of unsingulated devices are formed in a matrix;

bringing a plurality of contacts electrically connected to a plurality of terminals of a test circuit into contact with a plurality of contact terminals provided on one side in the panel level package in a row direction of the matrix and connected via a plurality of lead-out wirings to an internal circuit of each device in each row of the plurality of devices, respectively; and testing, by the test circuit, each device in the each row electrically connected via the plurality of contacts, wherein the panel level package comprises:

a substrate;

a plurality of semiconductor chips fixed on the substrate to form the matrix of the plurality of unsingulated devices, each of the plurality of unsingulated devices including a respective one of the plurality of semiconductor chips, wherein the panel level package is configured to be cut to singulate the plurality of unsingulated devices in order to provide a plurality of singulated devices, and wherein each of the plurality of singulated devices includes the respective one of the plurality of semiconductor chips and a portion of the substrate to which the respective one of the plurality of semiconductor chips is fixed.

2. The test method according to claim 1, wherein the testing includes burn-in testing each device in the each row in a state where the panel level package is placed on the placement unit in a heating furnace of a burn-in test apparatus.

3. The test method according to claim 2, further comprising:

preheating, before the testing, the panel level package to a predetermined temperature in a soaking unit outside the heating furnace in the burn-in test apparatus; and executing, before the testing, temperature control to bring a temperature of each device in the each row close to a target temperature in a state where the panel level package is placed on the placement unit in the heating furnace.

4. The test method according to claim 2, wherein the testing includes asynchronously burn-in testing a plurality of the panel level packages in a plurality of the heating furnaces of the burn-in test apparatus.

5. The test method according to claim 3, wherein the testing includes asynchronously burn-in testing a plurality of the panel level packages in a plurality of the heating furnaces of the burn-in test apparatus.

6. The test method according to claim 4, wherein test time for burn-in testing the plurality of panel level packages in the plurality of heating furnaces is different from each other according to a number of defectives or a failure rate of the plurality of devices formed in each of the plurality of panel level packages.

7. The test method according to claim 4, wherein the testing includes switching, upon completion of a burn-in test of one of the panel level packages, to a burn-in test of another of the panel level packages in each of the plurality of heating furnaces.

8. The test method according to claim 1, further comprising:

executing, before the testing, temperature control to bring a temperature of each device in the each row close to a target temperature.

9. The test method according to claim 8, wherein the executing the temperature control includes bringing, by a temperature adjustment unit provided in the placement unit, a surface of the panel level package on the placement unit side uniformly close to the target temperature.

10. The test method according to claim 1, further comprising:

executing, before the placing, a functional test in order to individually confirm operations of an initial plurality of semiconductor chips and forming the plurality of devices by using the plurality of semiconductor chips, which have been selected from the initial plurality of semiconductor chips and have been determined to be non-defective products as a result of this.

11. The test method according to claim 1, wherein the bringing into contact includes positioning a contactor provided with the plurality of contacts and the panel level package by using positioning members, which correspond to each other, included in both the contactor and the panel level package and then bringing the plurality of contacts into contact with the plurality of contact terminals, respectively.

12. A manufacturing method comprising:

testing, in the panel level package formed with the plurality of unsingulated devices, the plurality of unsingulated devices by the test method according to claim 1; and cutting out and singulating the plurality of unsingulated devices from the panel level package to form the plurality of singulated devices.

13. The manufacturing method according to claim 12, further comprising:

selecting a selected plurality of singulated devices by using a result of the testing.

14. The test method according to claim 1, wherein the matrix comprising rows of unsingulated devices, each row of unsingulated devices in the matrix extending in a row direction of the matrix, the panel level package further comprising:

a plurality of pads located on the front surface of the panel level package to one side of the matrix in the row direction of the matrix;

a redistribution layer including a plurality of lead-out wirings, each row of the matrix corresponding to one or more of the plurality of pads such that each of the plurality of pads has a corresponding row in the matrix, each of the plurality of pads being connected to the internal circuit of at least one of the plurality of semiconductor chips positioned in the corresponding row in the matrix; and a sealing portion sealing the redistribution layer and filling the space between the redistribution layer and the substrate and around the plurality of semiconductor chips with a sealing material.

15. A test apparatus comprising:

a placement unit on which a panel level package in which a plurality of unsingulated devices are formed in a matrix is placed;

a contactor configured to bring a plurality of contacts into contact with a plurality of contact terminals provided on one side in a row direction of the matrix in the panel level package and connected via a plurality of lead-out wirings to an internal circuit of each device in each row among the plurality of devices, respectively; and a test circuit which has a plurality of terminals electrically connected to the plurality of contacts and is configured to test each device in the each row electrically connected via the plurality of contacts, wherein the panel level package comprises:

a substrate;

a plurality of semiconductor chips fixed on the substrate to form the matrix of the plurality of unsingulated devices, each of the plurality of unsingulated devices including a respective one of the plurality of semiconductor chips, wherein the panel level package is configured to be cut to singulate the plurality of unsingulated devices in order to provide a plurality of singulated devices, and wherein each of the plurality of singulated devices includes the respective one of the plurality of semiconductor chips and a portion of the substrate to which the respective one of the plurality of semiconductor chips is fixed.

16. The test apparatus according to claim 15, wherein the test circuit is configured to burn-in test each device in the each row in a state where the panel level package is placed on the placement unit in a heating furnace of a burn-in test apparatus.

17. The test apparatus according to claim 16, further comprising:

a soaking unit which is provided outside the heating furnace in the burn-in test apparatus and is configured to preheat, before a test by the test circuit, the panel level package to a predetermined temperature; and a temperature adjustment unit configured to execute, before a test by the test circuit, temperature control to bring a temperature of each device in each row close to a target temperature in a state where the panel level package is placed on the placement unit in the heating furnace.

18. The test apparatus according to claim 16, wherein the test circuit is configured to asynchronously burn-in test a plurality of the panel level packages in a plurality of the heating furnaces of the burn-in test apparatus.

19. The test apparatus according to claim 15, wherein the matrix comprising rows of unsingulated devices, each row of unsingulated devices in the matrix extending in a row direction of the matrix, the panel level package further comprising:

a plurality of pads located on the front surface of the panel level package to one side of the matrix in the row direction of the matrix;

a redistribution layer including a plurality of lead-out wirings, each row of the matrix corresponding to one or more of the plurality of pads such that each of the plurality of pads has a corresponding row in the matrix, each of the plurality of pads being connected to the internal circuit of at least one of the plurality of semiconductor chips positioned in the corresponding row in the matrix; and a sealing portion sealing the redistribution layer and filling the space between the redistribution layer and the substrate and around the plurality of semiconductor chips with a sealing material.

20. A test apparatus comprising:

a placing means on which a panel level package in which a plurality of unsingulated devices are formed in a matrix is placed;

a contact means configured to bring a plurality of contacts into contact with a plurality of contact terminals provided on one side in a row direction of the matrix in the panel level package and connected via a plurality of lead-out wirings to an internal circuit of each device in each row among the plurality of devices, respectively; and a test means which has a plurality of terminals electrically connected to the plurality of contacts and is configured to test each device in the each row electrically connected via the plurality of contacts, wherein the panel level package comprises:

a substrate;

a plurality of semiconductor chips fixed on the substrate to form the matrix of the plurality of unsingulated devices, each of the plurality of unsingulated devices including a respective one of the plurality of semiconductor chips, wherein the panel level package is configured to be cut to singulate the plurality of unsingulated devices in order to provide a plurality of singulated devices, and wherein each of the plurality of singulated devices includes the respective one of the plurality of semiconductor chips and a portion of the substrate to which the respective one of the plurality of semiconductor chips is fixed.

* * * * *